US009922928B2

(12) United States Patent
Tonegawa

(10) Patent No.: US 9,922,928 B2
(45) Date of Patent: Mar. 20, 2018

(54) SEMICONDUCTOR DEVICE AND METHOD OF MANUFACTURING SEMICONDUCTOR DEVICE

(71) Applicant: Renesas Electronics Corporation, Koutou-ku, Tokyo (JP)

(72) Inventor: Takashi Tonegawa, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/217,983

(22) Filed: Jul. 23, 2016

(65) Prior Publication Data

US 2017/0092605 A1    Mar. 30, 2017

(30) Foreign Application Priority Data

Sep. 30, 2015   (JP) .................................. 2015-193172

(51) Int. Cl.
*H01L 23/528* (2006.01)
*H01L 21/31* (2006.01)
(Continued)

(52) U.S. Cl.
CPC .......... *H01L 23/5283* (2013.01); *H01L 21/31* (2013.01); *H01L 21/311* (2013.01);
(Continued)

(58) Field of Classification Search
CPC ............... H01L 21/31; H01L 21/31055; H01L 21/31053; H01L 21/31056; H01L 21/311;
(Continued)

(56) References Cited

U.S. PATENT DOCUMENTS 5,930,664 A * 7/1999 Hsu .................... H01L 21/31116
                                                      257/E21.252
6,426,281 B1 * 7/2002 Lin ......................... H01L 24/11
                                                      257/E21.508
(Continued)

FOREIGN PATENT DOCUMENTS

JP    59-232424 A    12/1984
JP    2003-338516 A    11/2003
(Continued)

OTHER PUBLICATIONS

Extended European Search Report, dated Feb. 27, 2017, in European Application No. 16189368.0.

*Primary Examiner* — Eduardo A Rodela
(74) *Attorney, Agent, or Firm* — Shapiro, Gabor and Rosenberger, PLLC

(57) ABSTRACT

Properties of a semiconductor device are improved. A semiconductor device is configured so as to have a protective film provided over an interconnection and having an opening, and a plating film provided in the opening. A slit is provided in a side face of the opening, and the plating film is also disposed in the slit. Thus, the slit is provided in the side face of the opening, and the plating film is also grown in the slit. This results in a long penetration path of a plating solution during subsequent formation of the plating film. Hence, a corroded portion is less likely to be formed in the interconnection (pad region). Even if the corroded portion is formed, a portion of the slit is corroded prior to the interconnection (pad region) at a sacrifice, making it possible to suppress expansion of the corroded portion into the interconnection (pad region).

17 Claims, 18 Drawing Sheets

(51) Int. Cl.
*H01L 21/44* (2006.01)
*H01L 21/311* (2006.01)
*H01L 23/00* (2006.01)
*H01L 21/3105* (2006.01)
H01L 23/482 (2006.01)
H01L 23/522 (2006.01)
H01L 23/48 (2006.01)
H01L 23/31 (2006.01)
H01L 23/532 (2006.01)

(52) U.S. Cl.
CPC ........ *H01L 21/31056* (2013.01); *H01L 21/44* (2013.01); *H01L 23/528* (2013.01); *H01L 23/53295* (2013.01); *H01L 24/03* (2013.01); *H01L 24/08* (2013.01); *H01L 24/48* (2013.01); *H01L 24/85* (2013.01); H01L 23/3171 (2013.01); H01L 23/481 (2013.01); H01L 23/4827 (2013.01); H01L 23/522 (2013.01); H01L 23/53223 (2013.01); H01L 24/29 (2013.01); H01L 24/32 (2013.01); H01L 24/37 (2013.01); H01L 24/45 (2013.01); H01L 24/73 (2013.01); H01L 24/84 (2013.01); H01L 2224/0215 (2013.01); H01L 2224/02126 (2013.01); H01L 2224/02145 (2013.01); H01L 2224/02206 (2013.01); H01L 2224/02215 (2013.01); H01L 2224/031 (2013.01); H01L 2224/0345 (2013.01); H01L 2224/03464 (2013.01); H01L 2224/03522 (2013.01); H01L 2224/04034 (2013.01); H01L 2224/04042 (2013.01); H01L 2224/05007 (2013.01); H01L 2224/05017 (2013.01); H01L 2224/05023 (2013.01); H01L 2224/05025 (2013.01); H01L 2224/05027 (2013.01); H01L 2224/05083 (2013.01); H01L 2224/05124 (2013.01); H01L 2224/05155 (2013.01); H01L 2224/05164 (2013.01); H01L 2224/05558 (2013.01); H01L 2224/05562 (2013.01); H01L 2224/05568 (2013.01); H01L 2224/05582 (2013.01); H01L 2224/05644 (2013.01); H01L 2224/05655 (2013.01); H01L 2224/05664 (2013.01); H01L 2224/29339 (2013.01); H01L 2224/32245 (2013.01); H01L 2224/37147 (2013.01); H01L 2224/45147 (2013.01); H01L 2224/48247 (2013.01); H01L 2224/48463 (2013.01); H01L 2224/48799 (2013.01); H01L 2224/48844 (2013.01); H01L 2224/73265 (2013.01); H01L 2224/8385 (2013.01); H01L 2224/84801 (2013.01); H01L 2224/85045 (2013.01); H01L 2224/85181 (2013.01); H01L 2224/85203 (2013.01); H01L 2924/0509 (2013.01); H01L 2924/05042 (2013.01); H01L 2924/05442 (2013.01); H01L 2924/07025 (2013.01); H01L 2924/1203 (2013.01); H01L 2924/1206 (2013.01); H01L 2924/13055 (2013.01); H01L 2924/13091 (2013.01); H01L 2924/15747 (2013.01); H01L 2924/35121 (2013.01)

(58) Field of Classification Search
CPC ......... H01L 21/31105; H01L 21/31111; H01L 21/31116; H01L 21/44; H01L 21/441; H01L 23/52; H01L 23/522; H01L 23/528; H01L 23/5283; H01L 23/481; H01L 23/482; H01L 23/4824; H01L 23/4827
See application file for complete search history.

(56) References Cited

U.S. PATENT DOCUMENTS

| | | | |
|---|---|---|---|
| 6,686,660 B2 | 2/2004 | Nemoto | |
| 6,908,311 B2* | 6/2005 | Ono | H01L 24/11 257/E21.508 |
| 8,309,856 B2* | 11/2012 | Kuroda | H05K 3/244 174/257 |
| 2002/0109234 A1* | 8/2002 | Park | H01L 21/76805 257/767 |
| 2005/0258484 A1* | 11/2005 | Itou | H01L 24/03 257/341 |
| 2006/0035453 A1* | 2/2006 | Kim | H01L 21/4853 438/613 |
| 2012/0032338 A1 | 2/2012 | Komori | |
| 2013/0099383 A1* | 4/2013 | Meyer-Berg | H01L 23/5226 257/772 |
| 2014/0116760 A1* | 5/2014 | Wang | H01L 23/3192 174/257 |
| 2015/0215289 A1* | 7/2015 | Heo | H04L 63/0421 713/162 |
| 2015/0364420 A1 | 12/2015 | Lin et al. | |

FOREIGN PATENT DOCUMENTS

| | | |
|---|---|---|
| JP | 2011-204886 A | 10/2011 |
| JP | 2012-146720 A | 8/2012 |
| WO | WO 2011/100021 A2 | 8/2011 |
| WO | WO 2011/117939 A1 | 9/2011 |

* cited by examiner

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2015-193172 filed on Sep. 30, 2015 including the specification, drawings and abstract is incorporated herein by reference in its entirety.

BACKGROUND

The present invention relates to a semiconductor device and a method of manufacturing the semiconductor device. For example, the invention can be preferably applied to a semiconductor device having a plating film on a pad region.

A semiconductor device including a semiconductor element such as MOSFET and an interconnection is formed by stacking an insulating film such as a silicon oxide film or a silicon nitride film, a semiconductor film, and a conductive film on a semiconductor substrate. Such a semiconductor element is electrically coupled to a pad region via the interconnection. The pad region is coupled to an external terminal via wire bonding, clip bonding, or the like.

For example, Japanese Unexamined Patent Application Publication No. 2003-338516 discloses a semiconductor device in which an under-bump metal film is provided on an aluminum electrode. The under-bump metal film has a first plating film and a second plating film provided on the first plating film. The first and second plating films are provided in an opening of an organic insulating film such that the first plating film has a thickness larger than the organic insulating film, and the periphery of the first plating film overlaps on the organic insulating film.

Japanese Unexamined Patent Application Publication No. 2011-204886 discloses a technique of coupling an electrode pad to a lead frame by a copper clip via a solder material.

SUMMARY

The inventors have engaged in research and development of a semiconductor device having a plating film (OPM electrode) on a pad region, and made an earnest investigation on improving properties of the semiconductor device. During such an investigation, the inventors have found a problem of separation at an interface between the plating film and the pad region, and found that there is room for further improvement in a configuration of a portion near a boundary between the pad region and the plating film (OPM electrode).

Other issues and novel features will be clarified from the description of this specification and the accompanying drawings.

A configuration described in a typical embodiment disclosed in this application is briefly summarized as follows.

A semiconductor device described in the typical embodiment disclosed in this application includes an insulating film provided on an interconnection and having an opening, and a plating film provided in the opening. A slit is provided in a side face of the opening, and a plating layer is also disposed in the slit.

A method of manufacturing a semiconductor device described in a typical embodiment disclosed in this application includes a step of forming an opening exposing part of a surface of an interconnection in an insulating film on the interconnection, and a step of forming a plating film in the opening. The opening has a slit in its sidewall, and a plating film is also formed in the slit.

According to the semiconductor device described in the typical embodiment disclosed in this application, properties of the semiconductor device can be improved.

According to the method of manufacturing a semiconductor device described in the typical embodiment disclosed in this application, a semiconductor device having good properties can be manufactured.

DETAILED DESCRIPTION

Although each of the following embodiments may be dividedly described in a plurality of sections or embodiments for convenience as necessary, they are not unrelated to one another except for the particularly defined case, and are in a relationship where one is a modification, an application, detailed explanation, supplementary explanation, or the like of part or all of another one. In each of the following embodiments, when the number of elements (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, it will be appreciated that a constitutional element (including an element step) of the embodiment is not necessarily indispensable except for the particularly defined case and for the case where the constitutional element is probably indispensable in principle. Similarly, in each of the following embodiments, when a shape of a constitutional element, a positional relationship, and the like are described, any configuration substantially closely related to or similar to such a shape or the like should be included except for the particularly defined case and for the case where the configuration is probably not included in principle. The same holds true in the number of elements and the like (including the number, a numerical value, amount, and a range).

Hereinafter, some embodiments of the invention will be described in detail with reference to the accompanying drawings. In all drawings for explaining the embodiments, components having the same function are designated by the same or relevant numeral, and duplicated description is omitted. In the following embodiments, the same or similar portion is not repeatedly described in principle except for a particularly required case.

In drawings used in the embodiments, a section view may also not be hatched for better viewability.

In each section view, size of each site does not correspond to that of an actual device, and a specific site may be illustrated relatively large for better viewability.

First Embodiment

Figure 1:
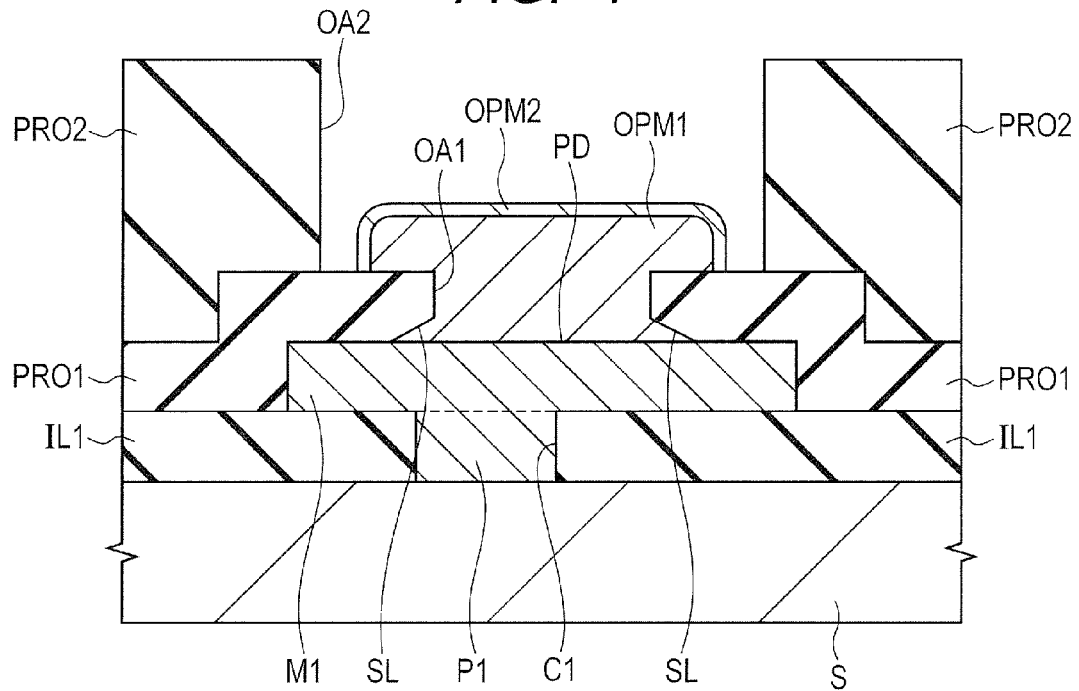
FIG. 1 is a section view illustrating a configuration of a semiconductor device of a first embodiment.

A structure of a semiconductor device of a first embodiment is now described with reference to drawings.
Description of Structure FIG. 1 is a section view illustrating a configuration of the semiconductor device of the first embodiment. The semiconductor device of the first embodiment includes a semiconductor substrate S, an interlayer insulating film IL1 provided on the semiconductor substrate S, and an interconnection M1 provided on the interlayer insulating film IL1. A semiconductor element is provided on the main surface of the semiconductor substrate S while being not shown in FIG. 1. For example, the interconnection M1 is electrically coupled to the semiconductor element via a plug P1.

Protective films PRO1 and PRO2 each including an insulating film are provided over the interconnection M1. The protective film PRO1 has an opening OA1, and part of the interconnection M1 is exposed from the bottom of the opening OA1. Such an exposed portion of the interconnection M1 is referred to as pad region PD. The protective film PRO2 has an opening OA2 that is disposed on the opening OA1 and a size larger than the opening OA1.

The interconnection M1 includes an aluminum film (Al film), for example. In other words, the interconnection M1 contains aluminum. The Al film described herein is not limited to pure Al film, and is a conductive material film (showing metallic conduction however) mainly containing aluminum. The Al film therefore includes a compound film or an alloy film of aluminum (Al) and silicon (Si), for example. A compositional ratio of Al in that film is desirably larger than 50 atomic percent.

The protective film PRO1 includes a silicon oxynitride film, for example. Not only the silicon oxynitride film but also a silicon oxide film or a silicon nitride film may be used as the protective film (cover film) PRO1. The protective film PRO2 includes a polyimide film, for example.

A plating film OPM1 is provided over the pad region PD as the bottom of the opening OA1. A plating film OPM2 is provided over the plating film OPM1. The plating film OPM1 includes a nickel (Ni) film, for example. The Ni film is formed over the pad region PD by electroless plating. The plating film OPM2 includes a gold (Au) film, for example. The Au film is formed over the plating film OPM1 by electroless plating. The plating films OPM1 and OPM2 may each be referred to as "over-pad metal" or "over-pad metal electrode (OPM electrode)" because such a plating film cover the pad region PD.

For example, the plating film OPM1 is provided to suppress formation of an undesired metal compound caused by direct contact of a bonding wire (conductive wire) described later to the pad region PD. For example, the plating film OPM2 is provided to improve adhesion of the bonding wire (conductive wire) described later to the plating film OPM1.

In the first embodiment, a slit (side slit, recess) SL is provided in a side face of the opening OA1. In FIG. 1, the slit SL is provided in a bottom portion of the side face of the opening OA1. The slit SL can be a portion of the side face retreated to the outside of the opening OA1. In this exemplary case, the slit SL has a tapered shape. From another perspective, the opening OA1 has an open region larger in its bottom than in its top. In FIG. 1, the open region in the bottom is a size larger than the open region in the top. The plating film OPM1 is also provided in the slit SL.

In this way, the slit SL is provided in the side face of the opening OA1, and the plating film OPM1 is also provided in the slit SL, making it possible to improve electrical coupling between the plating film OPM1 and the interconnection M1.

Figure 2:
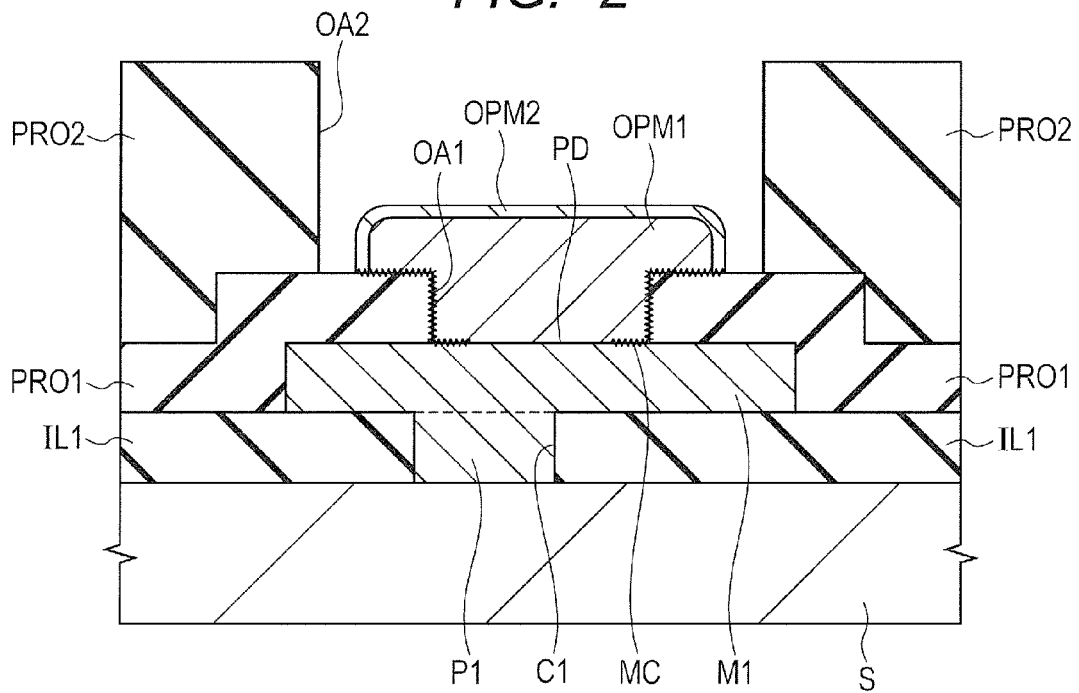
FIG. 2 is a section view illustrating a configuration of a semiconductor device of a comparative example.

FIG. 2 is a section view illustrating a configuration of a semiconductor device of a comparative example. In the comparative example of FIG. 2, a straight opening OA1 is provided without providing the slit SL. When the plating films OPM1 and OPM2 are formed by a plating process, a plating solution may penetrate into a space between the plating film OPM1 and the protective film PRO1. In particular, when a plurality of plating films (OPM1, OPM2) are formed over the pad region PD, for example, a plating solution for the plating film OPM2 may penetrate into a space between the plating film OPM1 and the protective film PRO1. Such penetration of the plating solution causes corrosion of a metal (here, Ni or Al) configuring a plating film or an interconnection as an underlayer. In particular, Al is readily corroded by the plating solution or washings as described later. In FIG. 2, a portion indicated by MC shows a penetration path of the plating solution and a corroded portion of the plating film OPM1 or the interconnection M1.

When the corroded portion MC is thus formed on the interconnection (Al film) M1, defective coupling occurs between the plating film OPM1 and the interconnection (pad region PD) M1. This further causes a reduction in adhesion between the plating film OPM1 and the interconnection M1, leading to easy separation therebetween.

Figure 3:
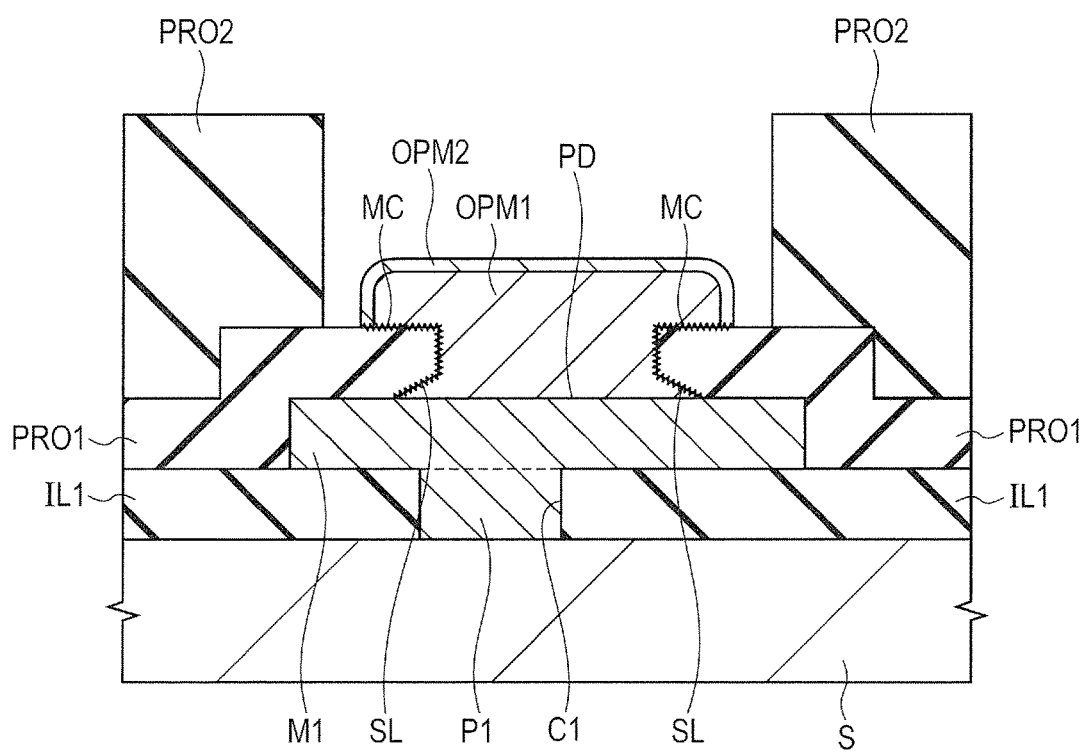
FIG. 3 is a section view schematically illustrating a penetration path of a plating solution and a corroded portion of a plating film or an interconnection.

In contrast, in the first embodiment, since the slit SL is provided in the side face of the opening OA1, a penetration path of the plating solution is long (see FIG. 3). The corroded portion MC is therefore less likely to be formed in the interconnection (pad region PD) M1. As illustrated in FIG. 3, even if the corroded portion MC is formed, a portion of the slit SL is corroded prior to the interconnection (pad region PD) M1 at a sacrifice, making it possible to suppress expansion of the corroded portion MC into the interconnection (pad region PD) M1. Furthermore, the plating film OPM1 filling the space in the slit SL suppresses separation between the plating film OPM1 and the interconnection M1. FIG. 3 is a section view schematically illustrating the penetration path of the plating solution and the corroded portion of the plating film or the interconnection.

The corroded portion MC may be caused not only by penetration of the plating solution but also by penetration of the washings. In particular, a washing process is performed using pure water or the like before and after a plating step, easily leading to corrosion due to penetration of the washings. In the first embodiment, it is also possible to suppress expansion of the corroded portion MC against such penetration of the washings.

Figure 4:
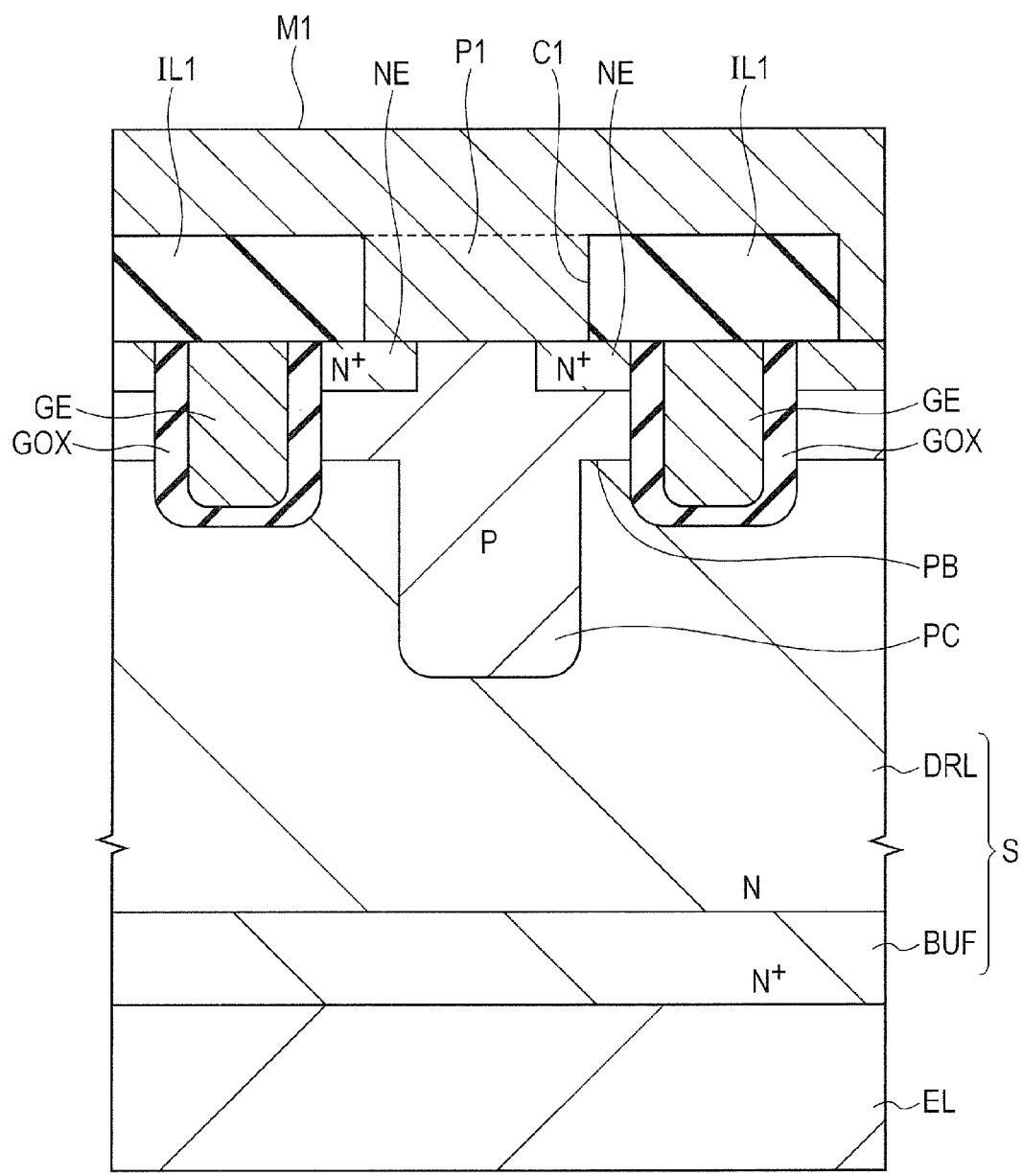
FIG. 4 is a section view of power MOSFET as an exemplary semiconductor element.

The semiconductor element provided on the main surface of the semiconductor substrate S is now described. Although the semiconductor element provided on the main surface of the semiconductor substrate S is not particularly limited, a power metal-oxide-semiconductor field-effect transistor (MOSFET) can be exemplified as the semiconductor element. FIG. 4 is a section view of power MOSFET as an exemplary semiconductor element. The power MOSFET illustrated in FIG. 4 is a trench-gate longitudinal MOSFET. The MOSFET is an n-channel MOSFET.

The power MOSFET illustrated in FIG. 4 has a buffer layer BUF and a drift layer DRL over the buffer layer BUF. The buffer layer BUF is an $n^+$ semiconductor layer, and the drift layer DRL is an n semiconductor layer. The buffer layer BUF and the drift layer DRL configure the semiconductor substrate S, for example.

A p body region PB including a p semiconductor region is provided in an upper part of the drift layer DRL. Furthermore, n emitter regions NE each including an $n^+$ semiconductor layer is provided on the p body region PB. A p column PC including a p semiconductor region is provided under the p body region PB.

Trenches are provided so as to be deeper than the p body region PB and extend into the drift layer DRL. A gate insulating film GOX is provided on an inner wall of each trench, and a gate electrode GE is provided over the gate insulating film GOX so as to fill the inside of the trench.

An interlayer insulating film IL1 is provided over the gate electrode GE, and the interconnection M1 is provided on the n emitter region NE and the p body region PB with the plug P1 in between. A back electrode EL is provided on the bottom of the buffer layer BUF. An undepicted interconnection, which is electrically coupled to the gate electrode GE, is also provided in the section illustrated in FIG. 4.

In this exemplary case, for example, the interconnection M1 is a top-layer interconnection, the protective films PRO1 and PRO2 described with reference to FIG. 1 are provided over the interconnection M1, and part of the interconnection M1 serves as the pad region PD (see FIG. 1).

Although the trench-gate longitudinal MOSFET has been exemplified as the semiconductor element in the first embodiment, the structure may also be applied to other semiconductor elements such as an insulated gate bipolar transistor (IGBT) and a fast recovery diode (FRD).

Description of Manufacturing Method

A method of manufacturing the semiconductor device of the first embodiment is now described while the configuration of the semiconductor device is further clarified. FIGS. 5 to 12 are each a section view illustrating a manufacturing process of the semiconductor device of the first embodiment.

First, a semiconductor element is formed on the main surface of the semiconductor substrate S. In this exemplary case, the power MOSFET illustrated in FIG. 4 is formed as the semiconductor element. A formation process of the power MOSFET is now exemplarily, but not limitedly, described with reference to FIG. 4.

First, a semiconductor substrate S, which includes a support substrate including an n semiconductor layer and an epitaxial layer formed on a surface of the support substrate, is provided as the semiconductor substrate S. The epitaxial layer includes the buffer layer BUF including the $n^+$ semiconductor layer and the drift layer DRL including the n semiconductor layer formed on the buffer layer BUF.

Subsequently, the p body region PB, the n emitter region NE, and a p column region PC are formed on an exposed surface side of the drift layer DRL. Such regions are formed by an ion implantation process, for example.

Subsequently, the upper part of the semiconductor substrate S is selectively etched to form a trench extending into the drift layer DRL. Subsequently, the gate insulating film GOX is formed over the semiconductor substrate S and the inside of the trench. For example, a silicon oxide film is formed as the gate insulating film GOX by a chemical vapor deposition (CVD) process. Subsequently, the gate electrode GE is formed on the gate insulating film GOX. For example, a polysilicon film is formed on the gate insulating film GOX by a CVD process. Subsequently, the polysilicon film is patterned to form the gate electrode GE.

Subsequently, the interlayer insulating film IL1 is formed over the gate electrode GE, the n emitter region NE, and the p body region PB. For example, a silicon oxide film is formed as the interlayer insulating film IL1 by a CVD process.

Subsequently, the interlayer insulating film IL1 over the n emitter region NE and the p body region PB are etched to form a contact hole C1. Subsequently, the interconnection M1 is formed over the contact hole C1 and the interlayer insulating film IL1. For example, an Al film is formed as the interconnection M1 by a sputtering process. The Al film has a thickness of about 5 µm, for example. An Al alloy film such as AlSi, AlCu, and AlSiCu may be used in place of the Al film. Subsequently, the Al film is patterned to form the interconnection M1.

Figure 5:
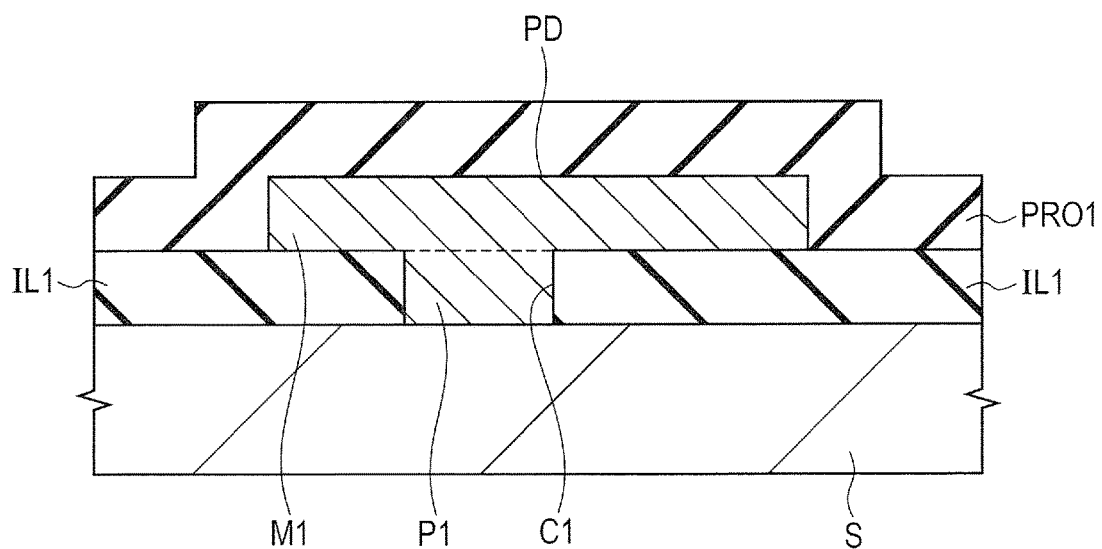
FIG. 5 is a section view illustrating a manufacturing process of the semiconductor device of the first embodiment.

Subsequently, as illustrated in FIG. 5, the protective film PRO1 is formed over the interconnection M1. For example, a silicon oxynitride film is deposited as the protective film PRO1 at a thickness of about 0.9 µm by a CVD process or the like over the interlayer insulating film IL1 and the interconnection M1.

Figure 6:
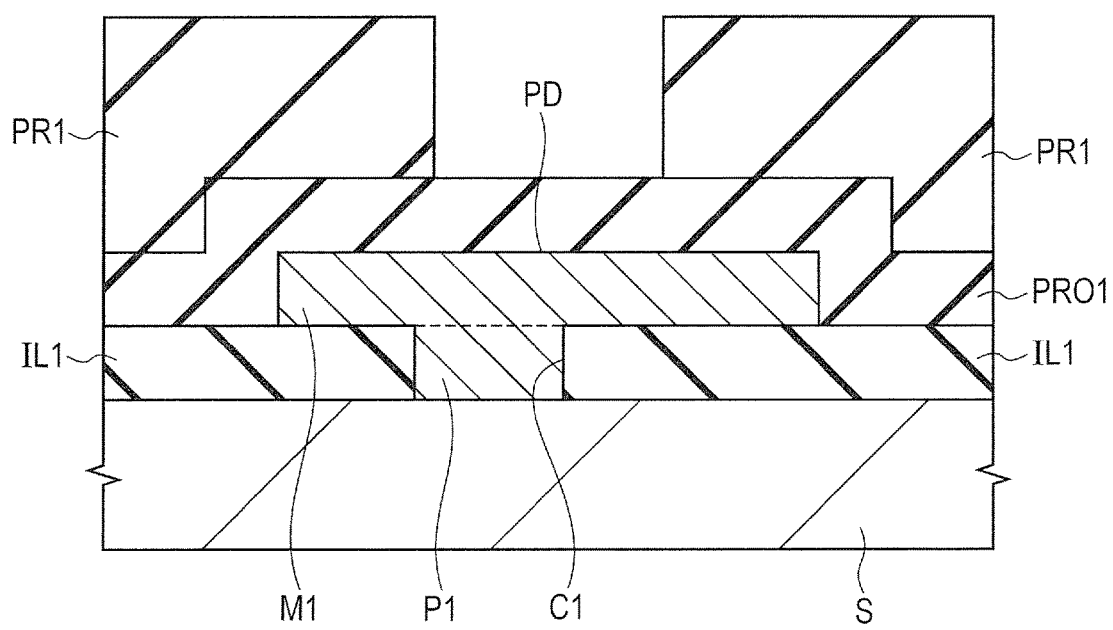
FIG. 6 is a section view illustrating the manufacturing process of the semiconductor device of the first embodiment, showing a manufacturing step following FIG. 5.
Figure 7:
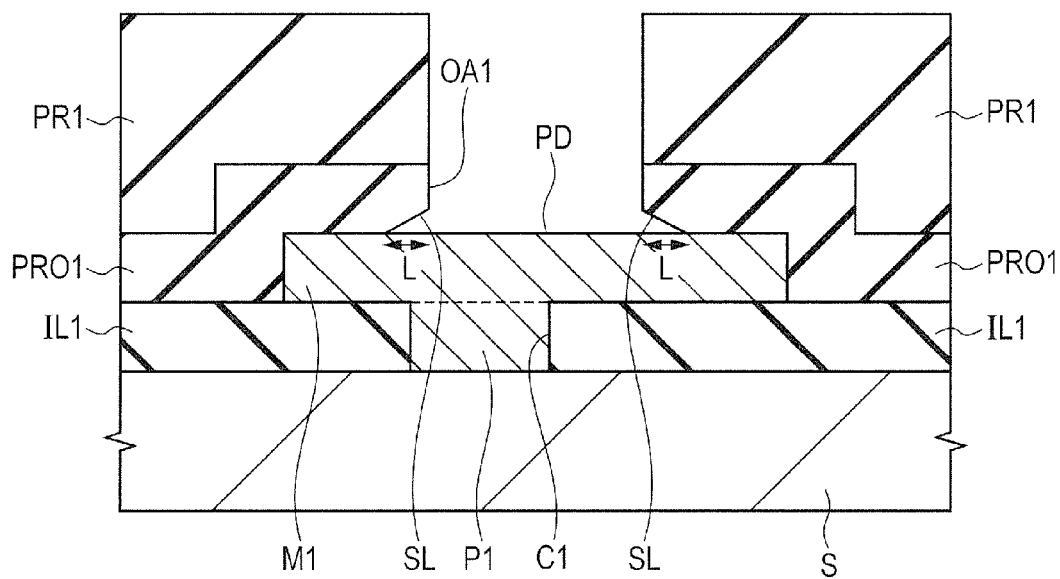
FIG. 7 is a section view illustrating the manufacturing process of the semiconductor device of the first embodiment, showing a manufacturing step following FIG. 6.

Subsequently, the protective film PRO1 on the pad region PD of the interconnection M1 (Al film) is removed to form the opening OA1. For example, as illustrated in FIG. 6, a photoresist film PR1 is formed on the protective film PRO1, and the photoresist film PR1 in a formation region of the opening OA1 is removed through exposure and development. Subsequently, as illustrated in FIG. 7, the protective film PRO1 is dry-etched with the photoresist film PR1 as a mask. Even after the interconnection M1 (Al film) is exposed, the protective film PRO1 is further etched, i.e., subjected to overetching.

Although the dry etching condition is not particularly limited, the dry etching is exemplarily performed using a mixed gas of $CF_4$ and $O_2$ as an etching gas under an atmosphere of microwave power of 800 to 1200 W, pressure of 60 to 100 Pa, and temperature of 60 to 100° C. The dry etching is isotropic etching because the semiconductor substrate is not biased. In other words, an isotropic component is larger than an anisotropic component in the etching. Such isotropic dry etching is performed, and furthermore the overetching is performed. The amount of the overetching is about 80%, for example. The amount of overetching of 80% means that etching is excessively performed for certain time, which corresponds to 80% of etching time before the pad region PD of the interconnection M1 (Al film) is exposed, for example.

The interconnection M1 (Al film) in the pad region PD is exposed through such dry etching. Furthermore, undercut is formed through subsequent overetching, and thus the slit SL is formed in the bottom portion of the side face of the opening OA1. The slit SL has a length (for example, length L in a lateral direction of the paper plane) of about 1 µm. The length of the slit SL is preferably 0.5 to 2.0 µm. Excessively short length of the slit SL, less than 0.5 µm, reduces the effect of suppressing the corroded portion MC. The length of the slit SL of more than 2.0 µm may cause short-circuit between conductive patterns (different interconnections and/or plugs) adjacent to each other. The length of the slit SL can be adjusted by the overetching amount.

In this exemplary case, normal etching, which is performed until the pad region PD of the interconnection M1 (Al film) is exposed, and the subsequent overetching are performed under the same condition. In another possible case, normal etching is performed in such a manner that, for example, the semiconductor substrate is biased to perform relatively anisotropic etching rather than the isotropic etching, and subsequent overetching is performed in such a manner that the semiconductor substrate is unbiased to perform relatively isotropic etching rather than anisotropic etching.

Figure 8:
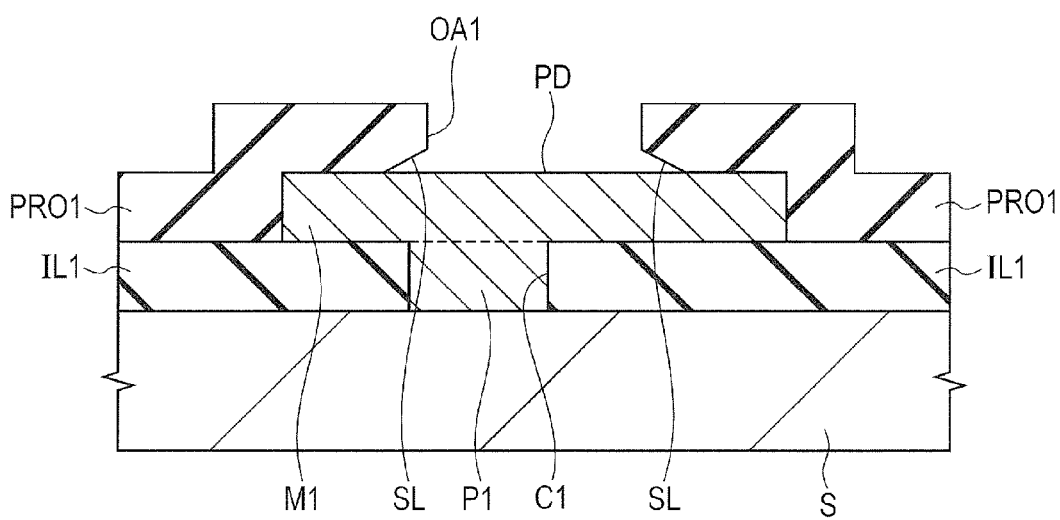
FIG. 8 is a section view illustrating the manufacturing process of the semiconductor device of the first embodiment, showing a manufacturing step following FIG. 7.
Figure 9:
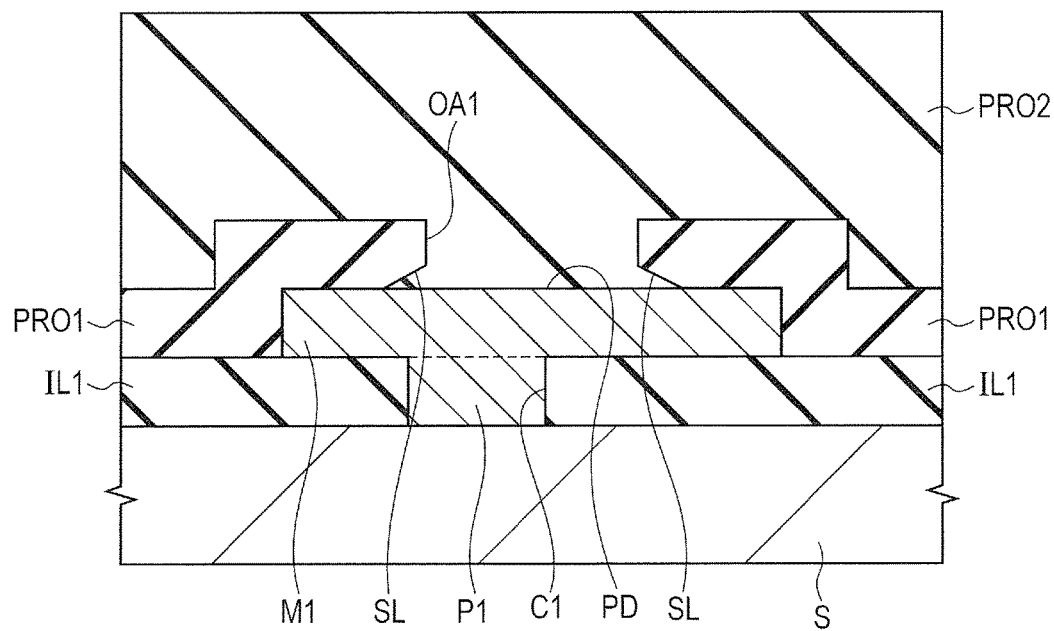
FIG. 9 is a section view illustrating the manufacturing process of the semiconductor device of the first embodiment, showing a manufacturing step following FIG. 8.
Figure 10:
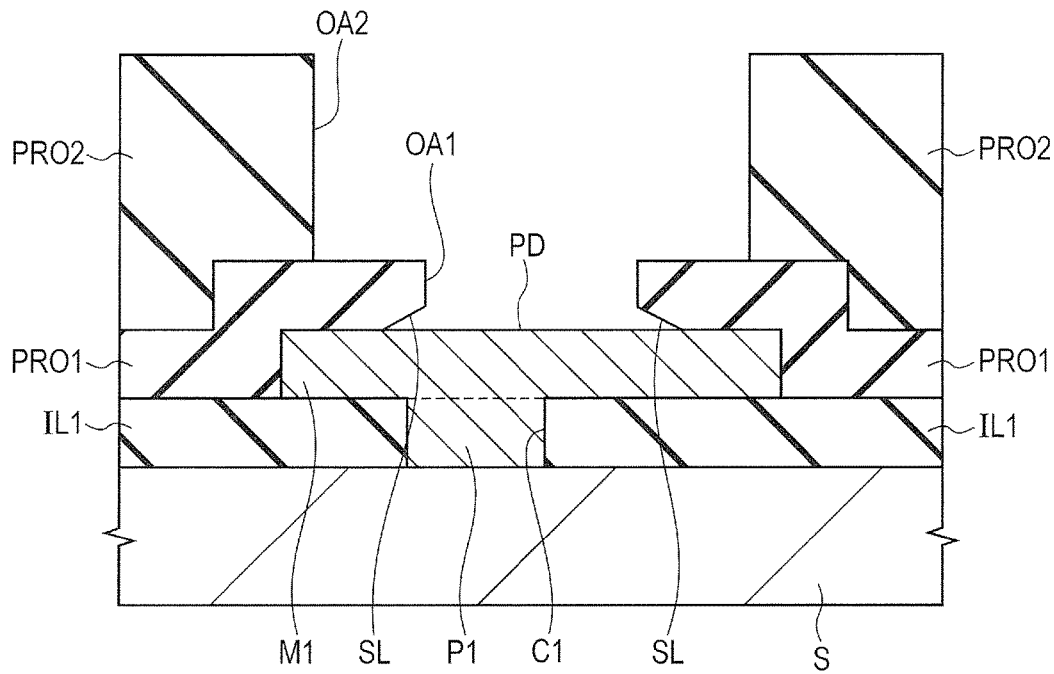
FIG. 10 is a section view illustrating the manufacturing process of the semiconductor device of the first embodiment, showing a manufacturing step following FIG. 9.

Subsequently, the photoresist film PR1 is removed by asking or the like (FIG. 8). Subsequently, the protective film PRO2 is formed over the protective film PRO1. For example, a polyimide film is formed as the protective film PRO2. For example, as illustrated in FIG. 9, polyimide resin is applied onto the protective film PRO1 and solidified, thereby a photosensitive polyimide film is formed. Subsequently, as illustrated in FIG. 10, the polyimide film in a formation region of the opening OA2 is removed through exposure and development. Consequently, the protective film (polyimide film) PRO2 having the opening OA2 a size larger than the opening OA1 can be formed so as to overlap with the opening OA1.

Figure 11:
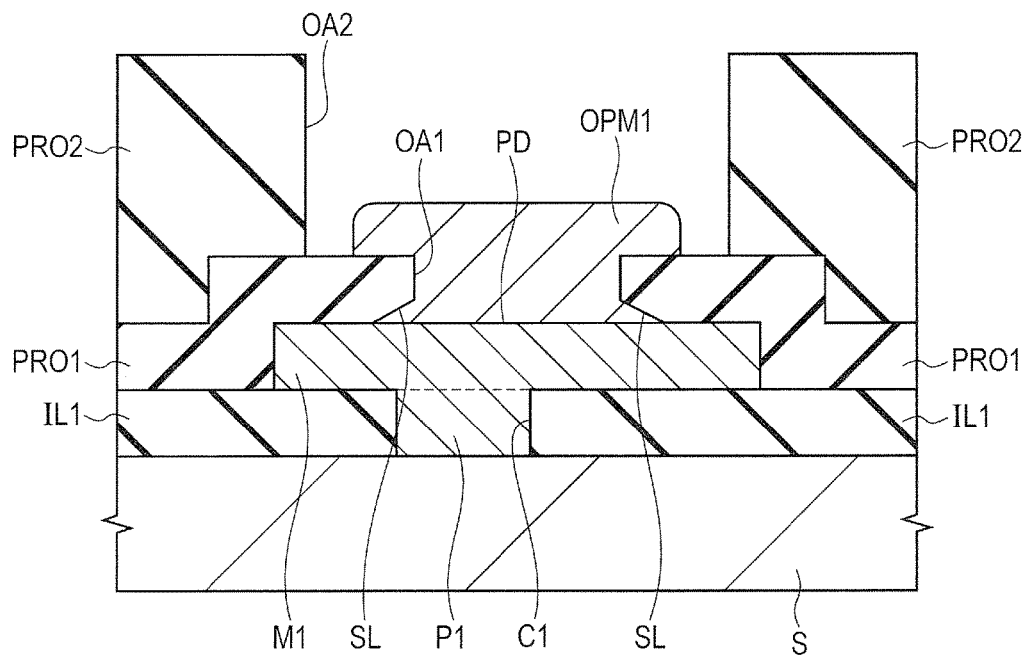
FIG. 11 is a section view illustrating the manufacturing process of the semiconductor device of the first embodiment, showing a manufacturing step following FIG. 10.

Subsequently, as illustrated in FIG. 11, the plating film OPM1 is formed in the opening OA1. For example, a Ni film is formed as the plating film OPM1 by an electroless plating process.

First, a natural oxide film and organic matter on a surface of the interconnection M1 (Al film) in the pad region PD are removed, the surface being exposed from the bottom of the opening OA1. The natural oxide film and the organic matter are removed by Ar plasma treatment, for example. Degreasing may be separately performed. Subsequently, first zincate treatment is performed. Specifically, a zincate solution is brought into contact with the pad region PD, and a Zn film is formed on the pad region PD through a substitution reaction of Zn with Al. Subsequently, the Zn film is separated using dilute nitric acid or the like. Subsequently, second zincate treatment is performed. Specifically, a zincate solution is brought into contact with the pad region PD, and a Zn film is formed on the pad region PD through a substitution reaction of Zn with Al. The zincate treatment is thus repeated two times, thereby a close and uniform Zn film can be formed. Subsequently, a plating film (Ni film) is grown with Zn in the undepicted Zn film as a nuclear.

For example, the pad region PD having the undepicted Zn film is brought into contact with a Ni plating solution, thereby the plating film (Ni film) OPM1 is formed. Specifically, a hypophosphorous-acid plating solution is used, and the semiconductor substrate S is dipped in the plating solution at about 85° C. for plating processing, so that the plating film (Ni film) OPM1 having a thickness of about 2.5 µm is formed. The plating film (Ni film) OPM1 is grown on the pad region PD while being formed in the slit SL in the bottom portion of the side face of the opening OA1.

Figure 12:
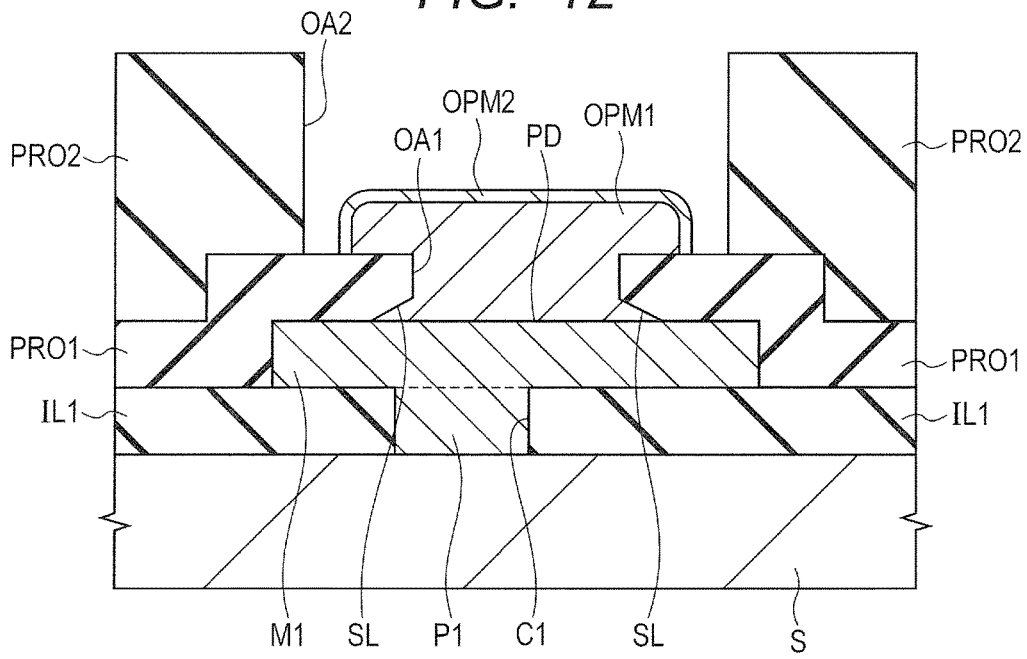
FIG. 12 is a section view illustrating the manufacturing process of the semiconductor device of the first embodiment, showing a manufacturing step following FIG. 11.

Subsequently, as illustrated in FIG. 12, the plating film OPM2 is formed over the plating film OPM1. For example, an Au film is formed as the plating film OPM2 by an electroless plating process. The plating film (Ni film) OPM1 on the pad region PD is brought into contact with an Au plating solution, thereby the plating film (Au film) OPM2 is formed. Specifically, a cyan plating solution is used, and the semiconductor substrate S is dipped in the plating solution at about 90° C. for plating processing, so that the plating film (Au film) OPM2 having a thickness of about 0.05 µm is formed.

A washing process may be appropriately performed during such a process. For example, washing may be performed with pure water after the first zincate treatment, after formation of the plating film OPM1, or after formation of the plating film OPM2.

In this way, in the first embodiment, the slit SL is provided in the side face of the opening OA1, and the plating film (Ni film) OPM1 is also grown in the slit SL. This results in a long penetration path of the plating solution during formation of the plating film (Au film) OPM2. The corroded portion MC is therefore less likely to be formed in the interconnection (pad region PD) M1. Moreover, even if the corroded portion MC is formed, the portion of the slit SL is corroded prior to the interconnection (pad region PD) M1 at a sacrifice, making it possible to suppress expansion of the corroded portion MC into the interconnection (pad region PD) M1 (see FIG. 3). Furthermore, the plating film OPM1 filling the space in the slit SL suppresses separation between the plating film OPM1 and the interconnection M1. Furthermore, even if a washing step is performed before and after the formation step of the plating film, the corroded portion MC is less likely to be formed in the interconnection (pad region PD) M1 because of the long penetration path of the washings. In addition, even if the corroded portion MC is formed, the portion of the slit SL is corroded prior to the interconnection (pad region PD) M1 at a sacrifice, making it possible to suppress expansion of the corroded portion MC into the interconnection (pad region PD) M1.

Subsequently, the back side of the semiconductor substrate S is polished to decrease thickness of the semiconductor substrate S, and a metal film or the like is deposited on the back of the semiconductor substrate S to form the back electrode EL (see FIG. 4). Subsequently, the semiconductor substrate S is subjected to dicing to be formed into individual semiconductor chips.

Second Embodiment

Figure 13:
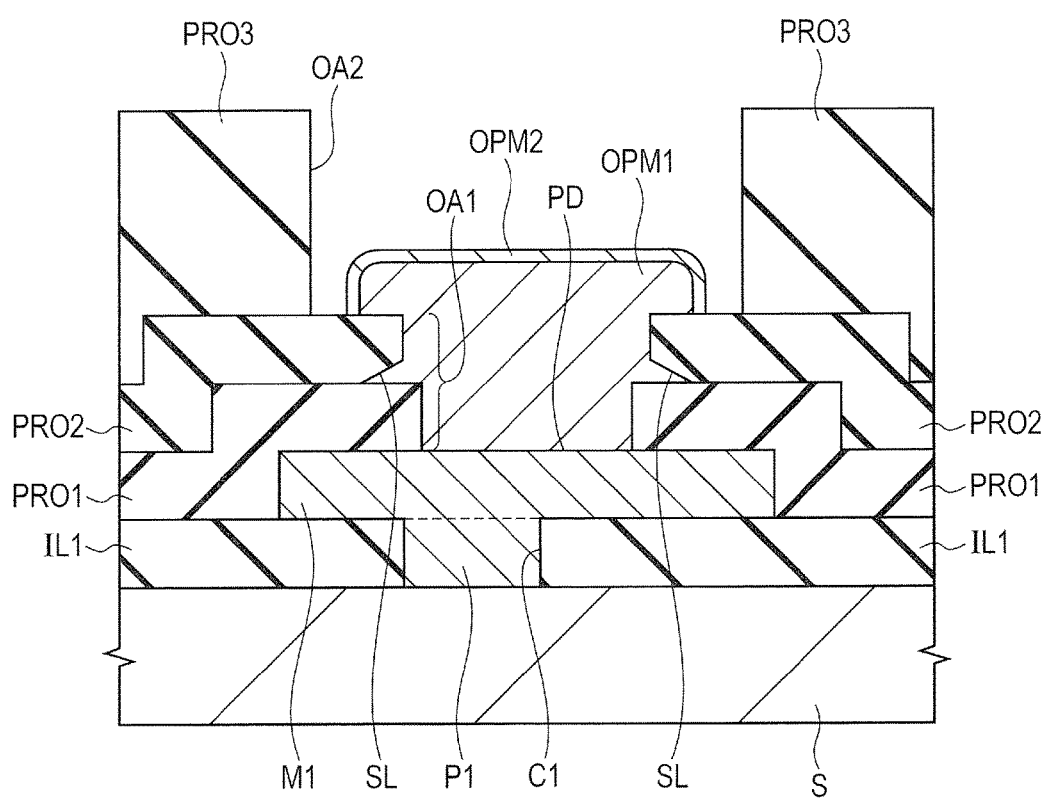
FIG. 13 is a section view illustrating a configuration of a semiconductor device of a second embodiment.

In the first embodiment, the protective film PRO1 is a single layer film, and the slit SL is provided in the bottom portion of the sidewall of the opening OA1. In another possible embodiment, the opening OA1 is provided in a stacked film, and the slit SL is provided in an intermediate portion of the sidewall of the opening OA1. A structure of a semiconductor device of a second embodiment is now described with reference to drawings.
Description of Structure FIG. 13 is a section view illustrating a configuration of the semiconductor device of the second embodiment. As with the first embodiment, the semiconductor device of the second embodiment includes a semiconductor substrate S, an interlayer insulating film IL1 provided on the semiconductor substrate S, and an interconnection M1 provided on the interlayer insulating film IL1. A semiconductor element is provided on the main surface of the semiconductor substrate S while being not shown in FIG. 13. For example, the interconnection M1 is electrically coupled to the semiconductor element via a plug P1.

The second embodiment is different from the first embodiment (FIG. 1) mainly in a stacking configuration of protective films and in a formation position of the slit SL; hence, such different points are described in detail.

As illustrated in FIG. 13, in the second embodiment, protective films PRO1, PRO2, and PRO3 each including an insulating film are provided on the interconnection M1. An opening OA1 is provided in a stacked film (stacked insulating film) of the protective films PRO1 and PRO2, and part of the interconnection M1 is exposed from the bottom of the opening OA1. Such an exposed portion of the interconnection M1 serves as a pad region PD. The protective film PRO3 has an opening OA2 that is disposed on the opening OA1 and a size larger than the opening OA1.

As with the first embodiment, the interconnection M1 includes an Al film, for example. The protective film PRO1 includes a silicon nitride film, for example. The protective film PRO2 on the protective film PRO1 includes a silicon oxynitride film, for example. Although the silicon nitride film and the silicon oxynitride film are used herein as a combination of the protective film PRO1 and the protective film PRO2, other combination may be used. For example, any other combination of two types of insulating films may be used as long as a certain etching selectivity can be provided. For example, a combination of a silicon oxynitride film and a silicon oxide film may be used as the combination of the protective film PRO1 and the protective film PRO2. The protective film PRO3 on the protective film PRO2 includes a polyimide film, for example.

As with the first embodiment, a plating film OPM1 (for example, Ni film) is provided over the pad region PD being the bottom of the opening OA1. As with the first embodiment, a plating film OPM2 (for example, Au film) is provided over the plating film OPM1.

In the second embodiment, the slit (side slit, recess) SL is provided in the side face of the opening OA1 at a boundary between the protective film PRO1 and the protective film PRO2. In FIG. 13, the slit SL is provided in an intermediate portion of the side face of the opening OA1. The slit SL can be a portion of the side face retreated to the outside of the opening OA1. The plating film OPM1 is also provided in the slit SL.

In this way, the slit SL is provided in the side face of the opening OA1, and the plating film OPM1 is also provided in the slit SL, making it possible to improve electrical coupling between the plating film OPM1 and the interconnection M1. Specifically, as described with reference to FIGS. 2 and 3 in the first embodiment, it is possible to suppress expansion of the corroded portion MC into the pad region PD due to penetration of a plating solution or washings.

In the second embodiment, as with the first embodiment, the semiconductor element provided on the main surface of the semiconductor substrate S is not particularly limited, and power MOSFET can be exemplified as the semiconductor element (see FIG. 4).
Description of Manufacturing Method A method of manufacturing the semiconductor device of the second embodiment is now described while the configuration of the semiconductor device is further clarified. FIGS. 14 to 23 are each a section view illustrating a manufacturing process of the semiconductor device of the second embodiment.

First, a semiconductor element is formed on the main surface of the semiconductor substrate S. For example, a power MOSFET is formed as in the first embodiment (see FIG. 4). Specifically, the semiconductor substrate S including the buffer layer BUF and the drift layer DRL is provided, and the p body region PB, the n emitter region NE, and the p column region PC are formed. A trench is formed in an upper part of the semiconductor substrate S, and the gate electrode GE is formed over the gate insulating film GOX in the trench. Subsequently, the interlayer insulating film IL1 is formed over the gate electrode GE and the like, and the interconnection M1 including an Al film is formed on the interlayer insulating film IL1.

Figure 14:
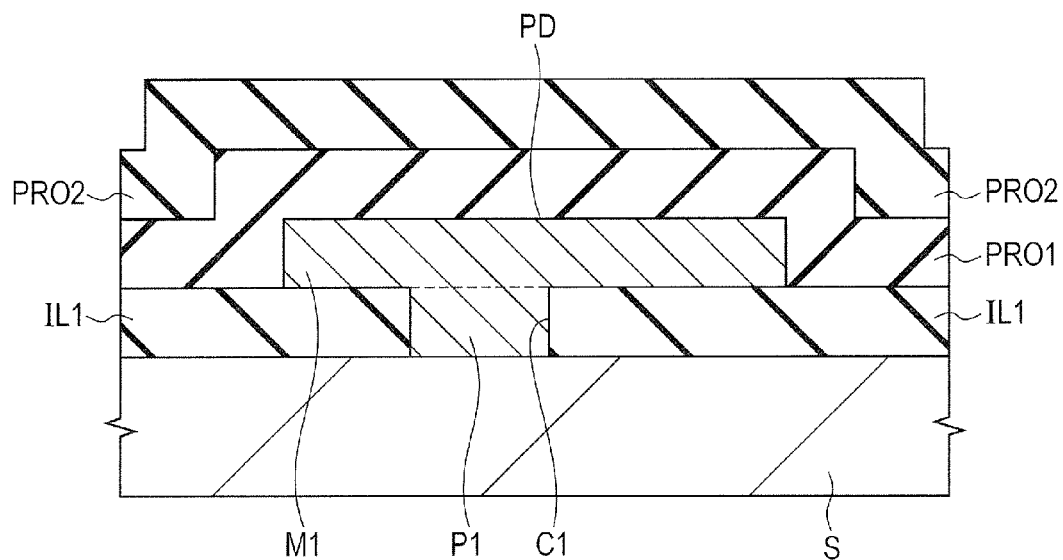
FIG. 14 is a section view illustrating a manufacturing process of the semiconductor device of the second embodiment.

Subsequently, as illustrated in FIG. 14, the protective films PRO1 and PRO2 are formed over the interconnection M1. For example, a silicon nitride film is deposited as the protective film PRO1 at a thickness of about 0.5 μm by a CVD process or the like over the interlayer insulating film IL1 and the interconnection M1. Subsequently, a silicon oxynitride film is deposited as the protective film PRO2 at a thickness of about 0.5 μm by a CVD process or the like.

Consequently, a stacked film including the protective films PRO1 and PRO2 is formed on the interconnection M1.

Figure 15:
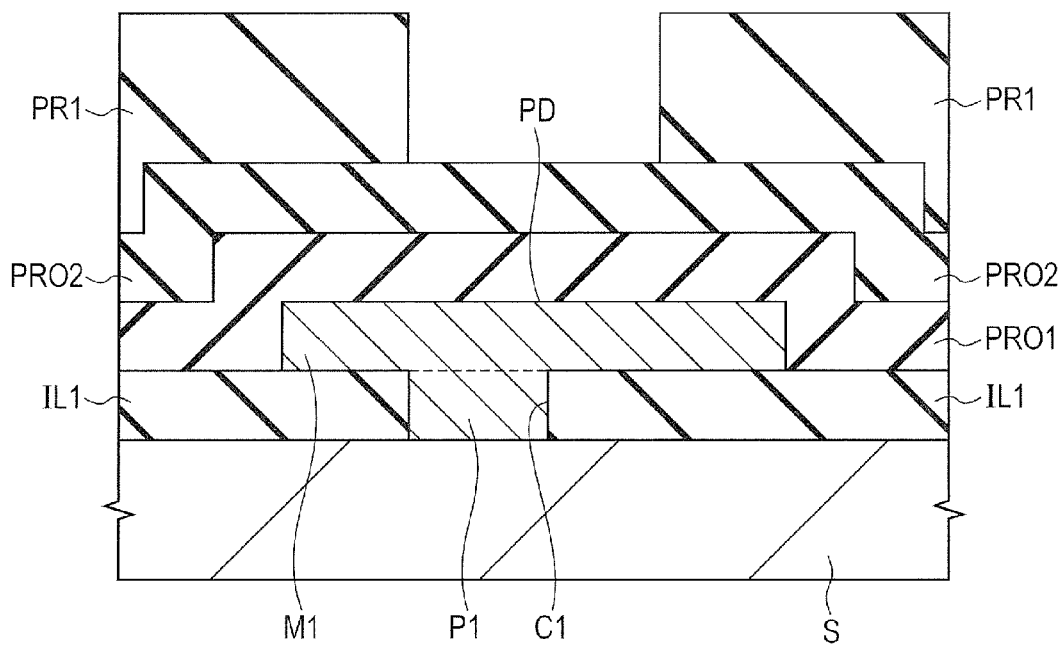
FIG. 15 is a section view illustrating the manufacturing process of the semiconductor device of the second embodiment, showing a manufacturing step following FIG. 14.
Figure 16:
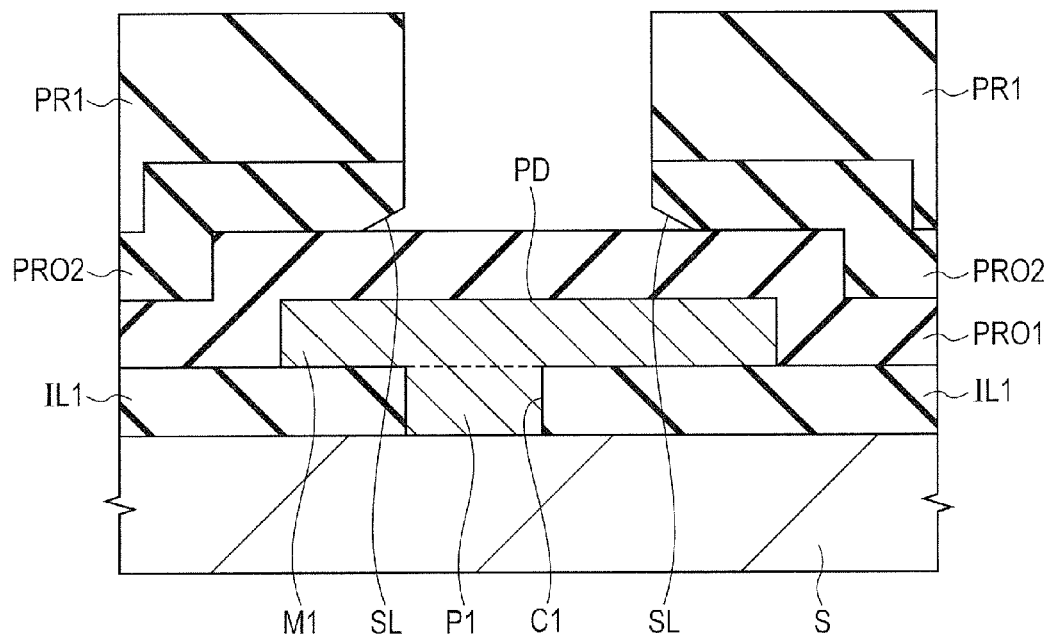
FIG. 16 is a section view illustrating the manufacturing process of the semiconductor device of the second embodiment, showing a manufacturing step following FIG. 15.

Subsequently, the stacked film (protective films PRO1 and PRO2) on the pad region PD of the interconnection M1 (Al film) is removed to form the opening OA1. For example, as illustrated in FIG. 15, a photoresist film PR1 is formed over the protective film PRO2, and the photoresist film PR1 is removed from a formation region of the opening OA1 through exposure and development. Subsequently, as illustrated in FIG. 16, the protective film PRO2 is dry-etched with the photoresist film PR1 as a mask. Even after the underlying protective film PRO1 is exposed, the protective film PRO2 is further etched, i.e., subjected to overetching.

Although the dry etching condition is not particularly limited, the dry etching is exemplarily performed using a mixed gas of $CF_4$ and $O_2$ as an etching gas under an atmosphere of microwave power of 800 to 1200 W, pressure of 60 to 100 Pa, and temperature of 60 to 100° C. The dry etching is isotropic etching because the semiconductor substrate is not biased. In other words, an isotropic component is larger than an anisotropic component in the dry etching. Such isotropic dry etching is performed, and furthermore the overetching is performed. The amount of the overetching is about 80%, for example.

Figure 17:
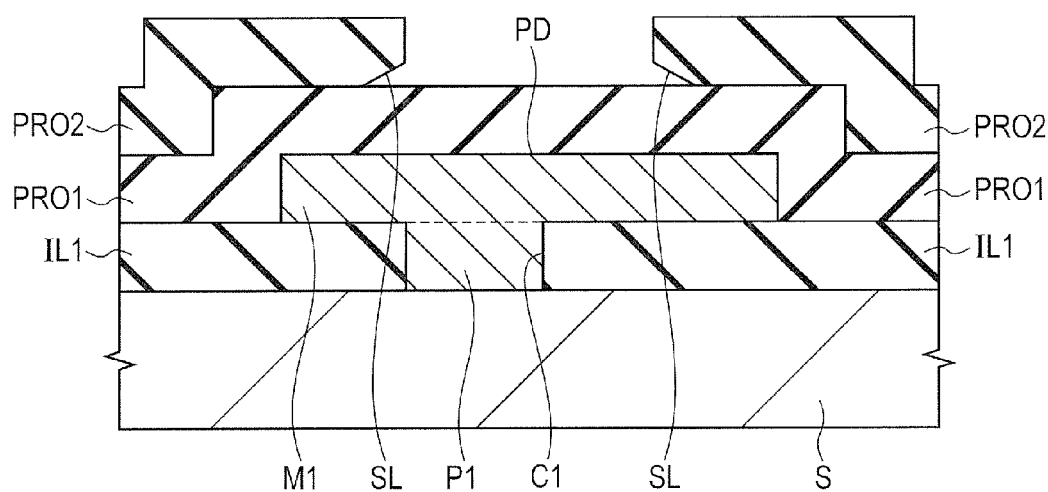
FIG. 17 is a section view illustrating the manufacturing process of the semiconductor device of the second embodiment, showing a manufacturing step following FIG. 16.

The protective film PRO1 is exposed through such dry etching. Furthermore, undercut is formed in the protective film PRO2 through subsequent overetching, and thus the slit SL is formed in the bottom portion of the side face of the protective film PRO2. The slit SL has a length of about 1 μm. The length of the slit SL is preferably 0.5 to 2.0 μm. The length of the slit SL can be adjusted by the overetching amount. Subsequently, the photoresist film PR1 is removed by asking or the like (FIG. 17).

Figure 18:
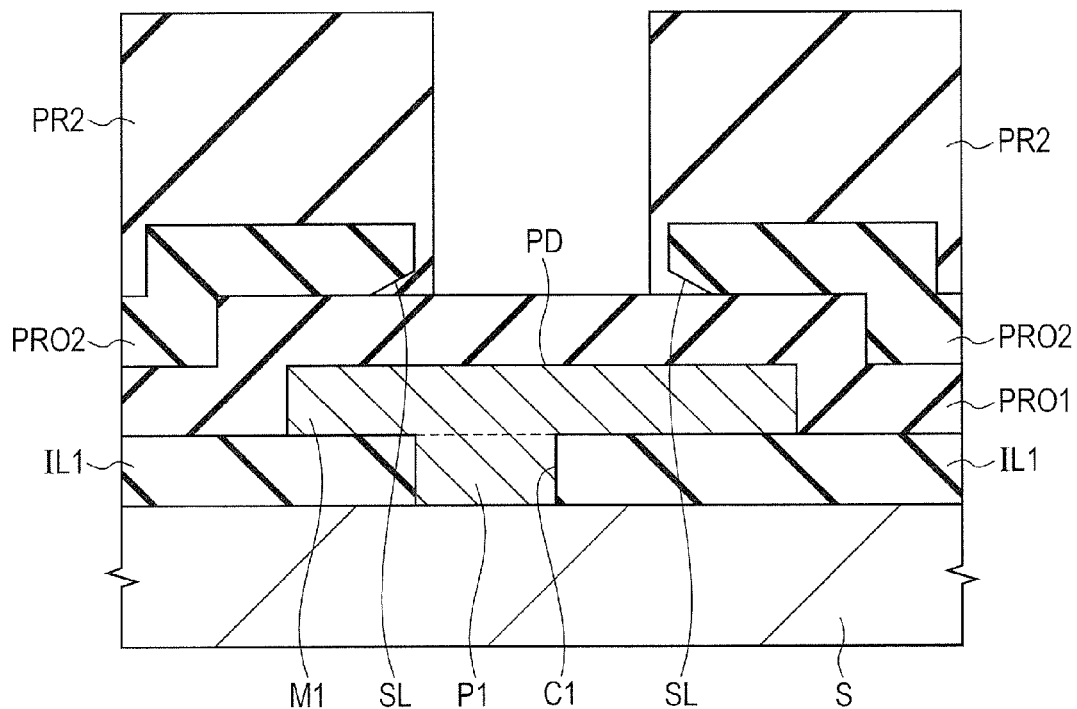
FIG. 18 is a section view illustrating the manufacturing process of the semiconductor device of the second embodiment, showing a manufacturing step following FIG. 17.
Figure 19:
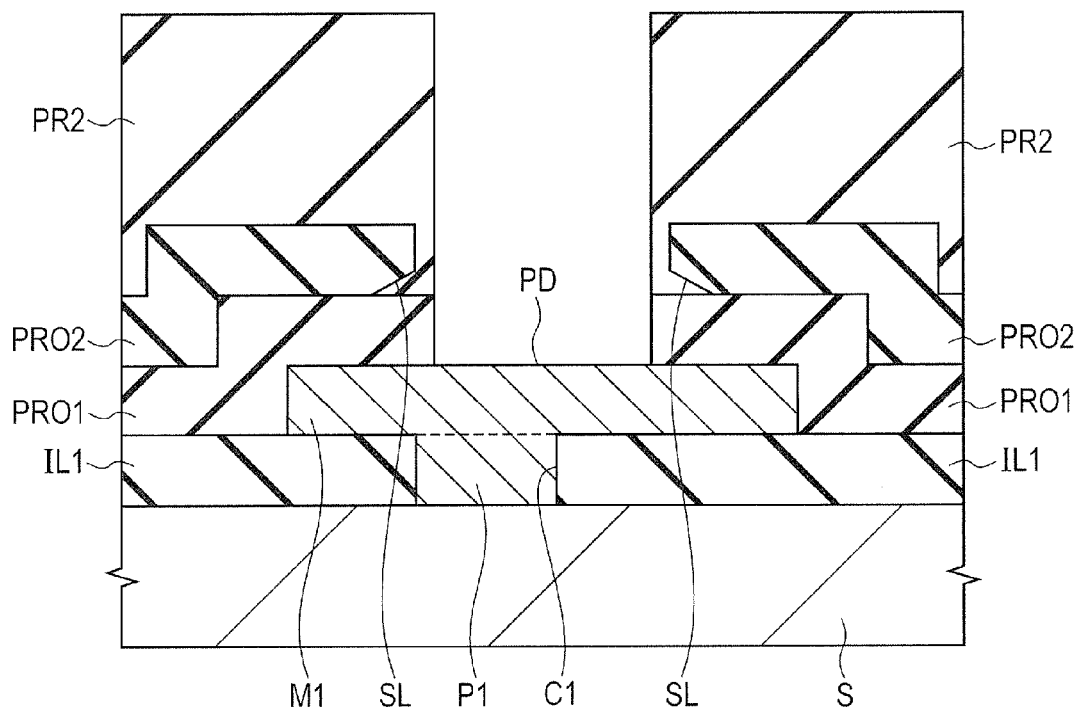
FIG. 19 is a section view illustrating the manufacturing process of the semiconductor device of the second embodiment, showing a manufacturing step following FIG. 18.

Subsequently, as illustrated in FIG. 18, a photoresist film PR2 is formed over the protective films PRO1 and PRO2, and the photoresist film PR2 is removed from a formation region of the opening OA1 through exposure and development. In this exemplary case, the photoresist film PR2 has an opening a size smaller than the opening of the protective film PRO2. The slit SL is therefore covered with the photoresist film PR2 and thus can be prevented from being deformed. If the slit SL can be maintained to a predetermined shape, the opening of the photoresist film PR2 may have the same size as the opening of the protective film PRO2. The protective film PRO1 may be etched with the protective film PRO2 as a mask. Subsequently, as illustrated in FIG. 19, the protective film PRO1 is dry-etched with the photoresist film PR2 as a mask.

Although the dry etching condition is not particularly limited, the dry etching is exemplarily performed using a mixed gas of $CF_3F$, $O_2$, and Ar as an etching gas under an atmosphere of pressure of 4 to 10 Pa and temperature of 30 to 60° C. The dry etching is performed while the semiconductor substrate is biased. For example, the dry etching is performed under a bias condition of an upper electrode set to 800 to 1200 W at 60 MHz, the upper electrode being disposed on an upper side of a stage as a mount for the semiconductor substrate S, and a lower electrode set to 100 to 500 W at 2 MHz, the lower electrode being disposed on a lower side of the stage.

The semiconductor substrate is biased in this way, which enhances straight advance performance of etching ions toward the substrate, leading to increased anisotropy. In other words, an anisotropic component becomes larger than an isotropic component. The anisotropy is further increased by decreasing pressure in a chamber.

Thus, in some possible case, the protective film PRO2 is subjected to dry etching with a relatively large isotropic component, while the protective film PRO1 is subjected to dry etching with a relatively large anisotropic component.

Figure 20:
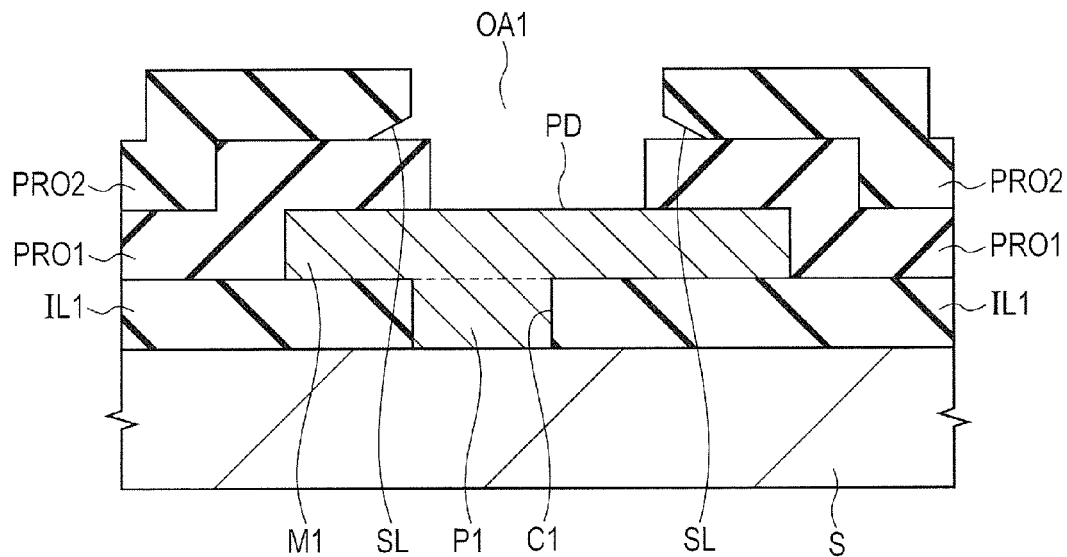
FIG. 20 is a section view illustrating the manufacturing process of the semiconductor device of the second embodiment, showing a manufacturing step following FIG. 19.

Subsequently, the photoresist film PR2 is removed by asking or the like (FIG. 20). Consequently, the slit SL is formed in the intermediate portion of the sidewall of the opening OA1 in the stacked film including the protective films PRO1 and PRO2.

Figure 21:
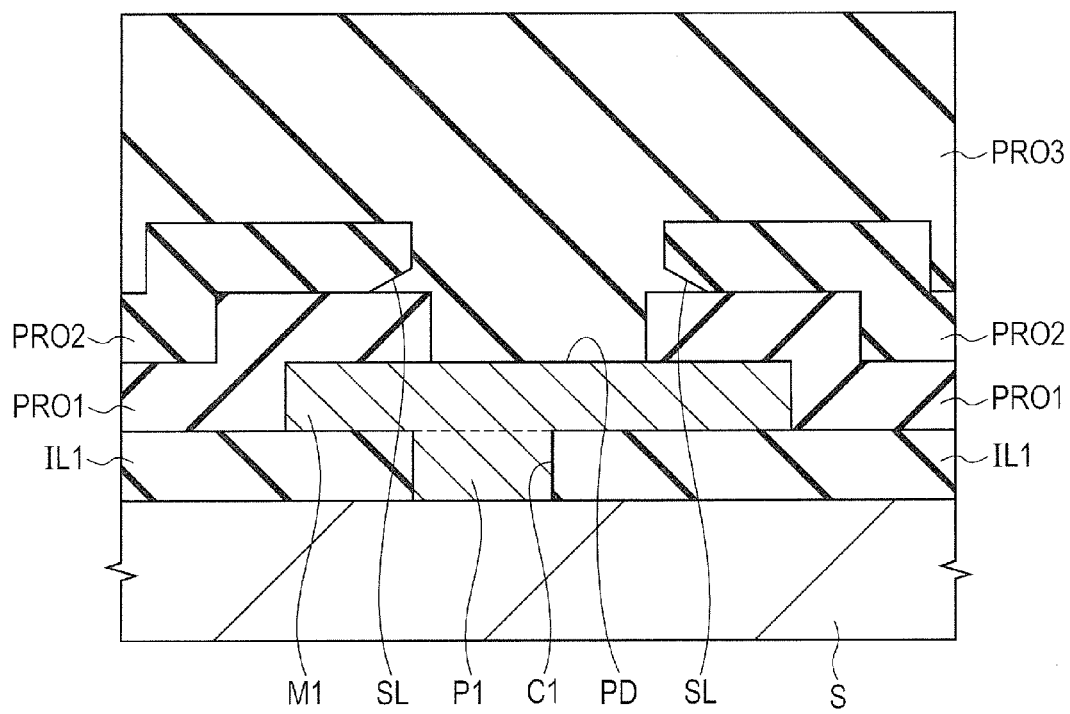
FIG. 21 is a section view illustrating the manufacturing process of the semiconductor device of the second embodiment, showing a manufacturing step following FIG. 20.
Figure 22:
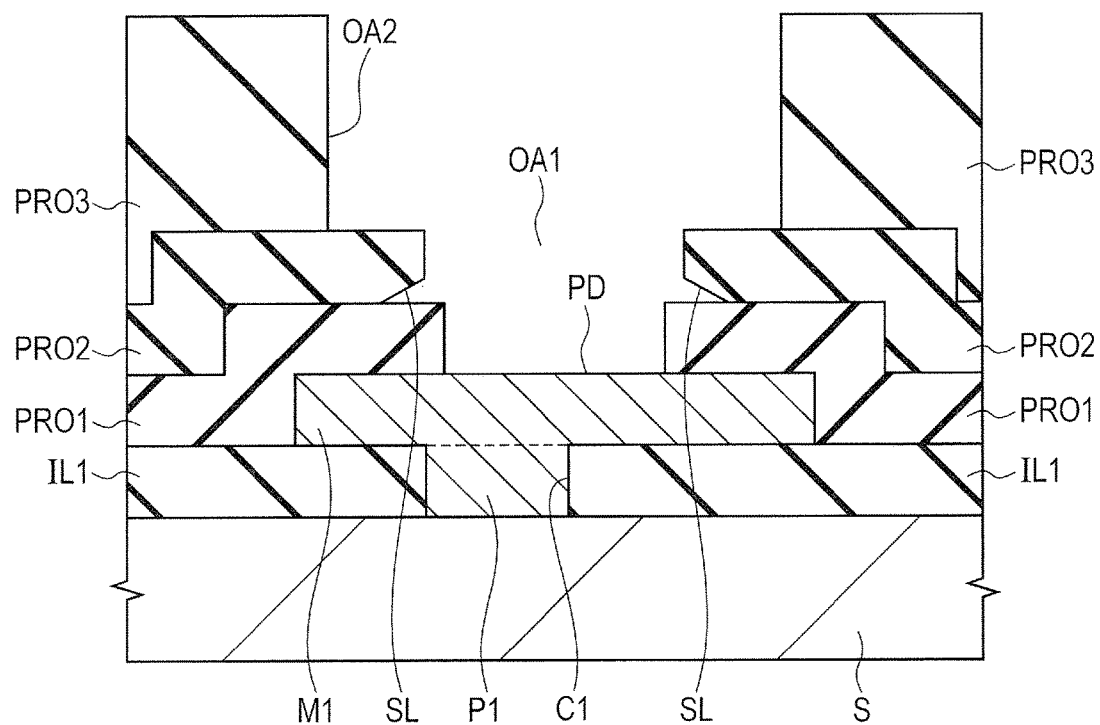
FIG. 22 is a section view illustrating the manufacturing process of the semiconductor device of the second embodiment, showing a manufacturing step following FIG. 21.

Subsequently, the protective film PRO3 is formed over the protective film PRO2. For example, a polyimide film is formed as the protective film PROS. As illustrated in FIG. 21, polyimide resin is applied onto the protective film PRO2 and solidified, thereby a photosensitive polyimide film is formed. Subsequently, as illustrated in FIG. 22, the polyimide film is removed from a formation region of the opening OA2 through exposure and development. Consequently, the protective film (polyimide film) PRO3 having the opening OA2 a size larger than the opening OA1 can be formed so as to overlap with the opening OA1.

Figure 23:
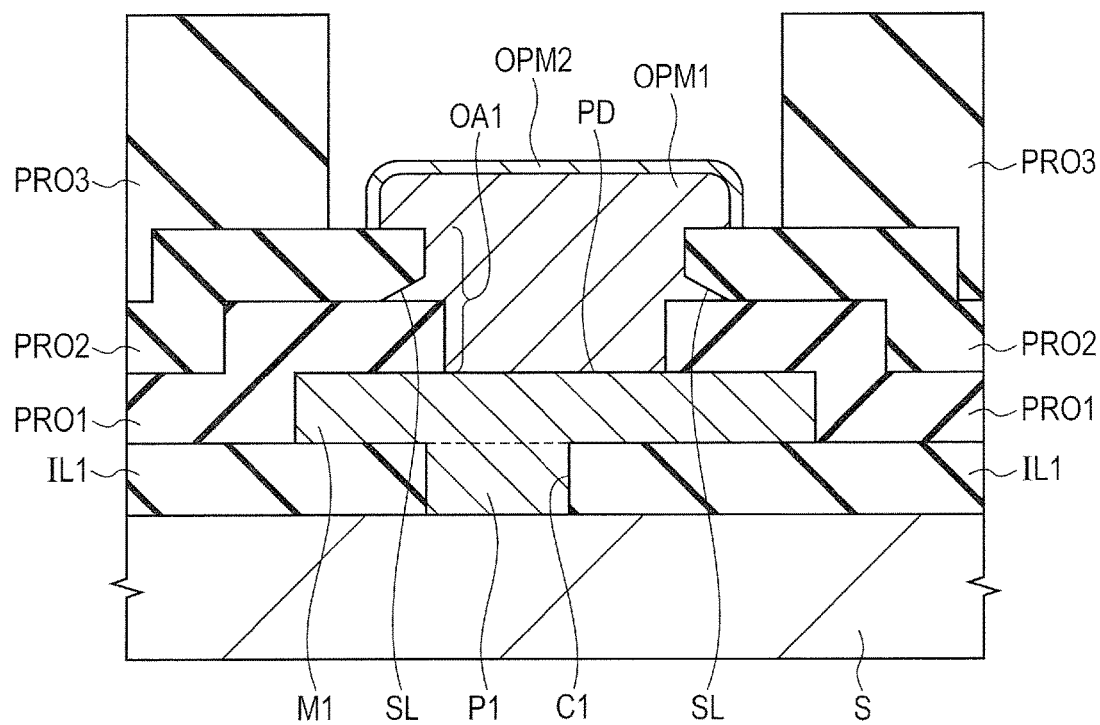
FIG. 23 is a section view illustrating the manufacturing process of the semiconductor device of the second embodiment, showing a manufacturing step following FIG. 22.

Subsequently, as illustrated in FIG. 23, the plating film OPM1 is formed in the opening OA1. For example, a Ni film is formed as the plating film OPM1 by an electroless plating process. The plating film OPM2 is formed over the plating film OPM1. For example, an Au film is formed as the plating film OPM2 by an electroless plating process. The plating films OPM1 and OPM2 can be formed as in the first embodiment.

In this way, in the second embodiment, the slit SL is provided in the intermediate portion of the side face of the opening OA1, and the plating film (Ni film) OPM1 is grown in the slit SL. It is therefore possible to suppresses expansion of the corroded portion MC into the interconnection (pad region PD) M1. Furthermore, the slit SL is provided in the intermediate portion of the side face of the opening OA1, thereby a distance to another interconnection (M1) is increased, making it possible to suppress short-circuit between the interconnections.

Subsequently, thickness of the semiconductor substrate S is decreased, and the back electrode EL (see FIG. 4) is formed, and then the semiconductor substrate S is subjected to dicing to be formed into individual semiconductor chips.

Third Embodiment

In a third embodiment, some applications are described.
First Application

Figure 24:
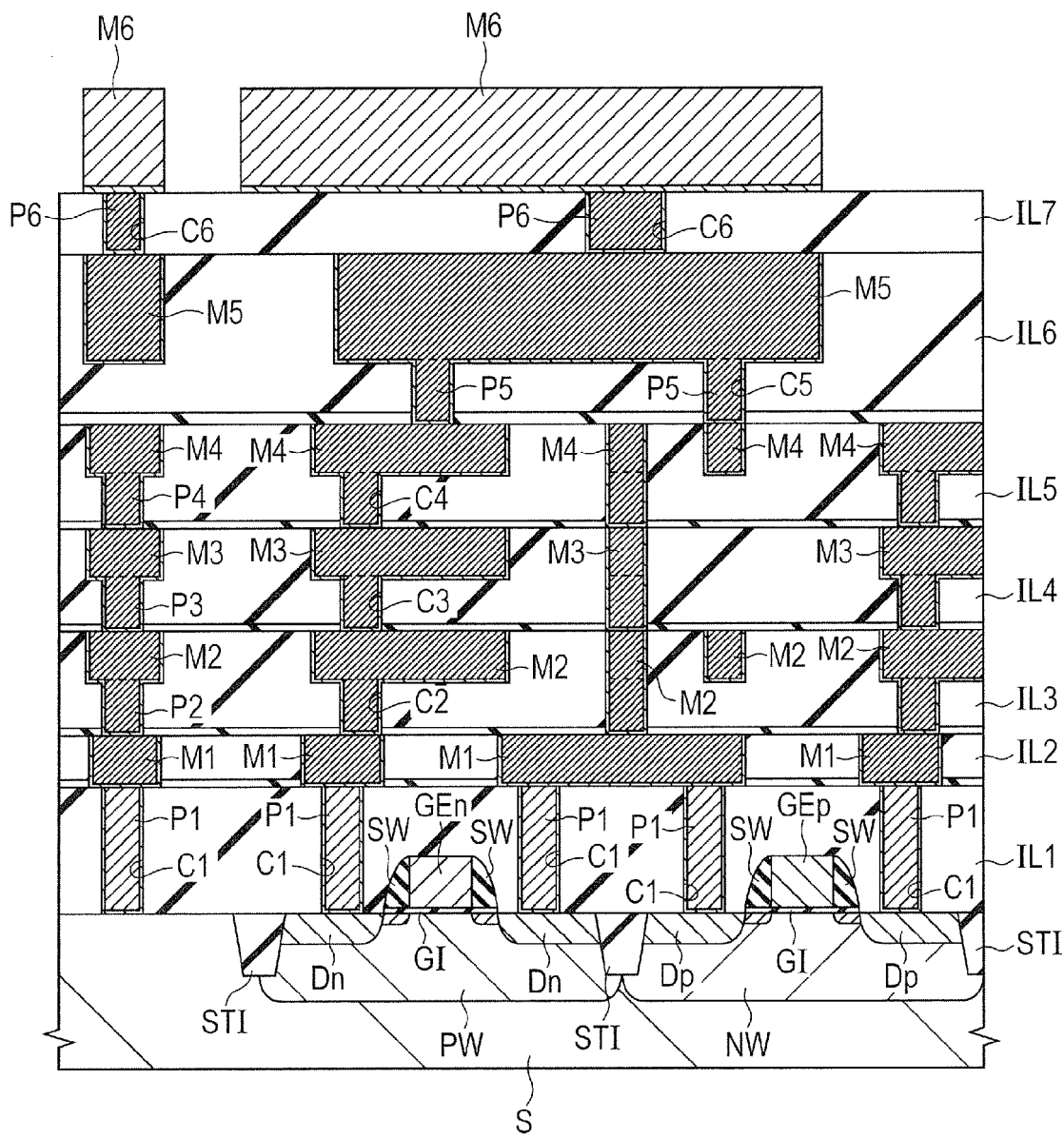
FIG. 24 is a section view illustrating a configuration of a semiconductor device of a first application of a third embodiment.

Although power MOSFET (FIG. 4) has been exemplified as the semiconductor element in the first and second embodiments, an n-channel MOSFET and a p-channel MOSFET as illustrated in FIG. 24 may be provided as the semiconductor element.

Figure 25:
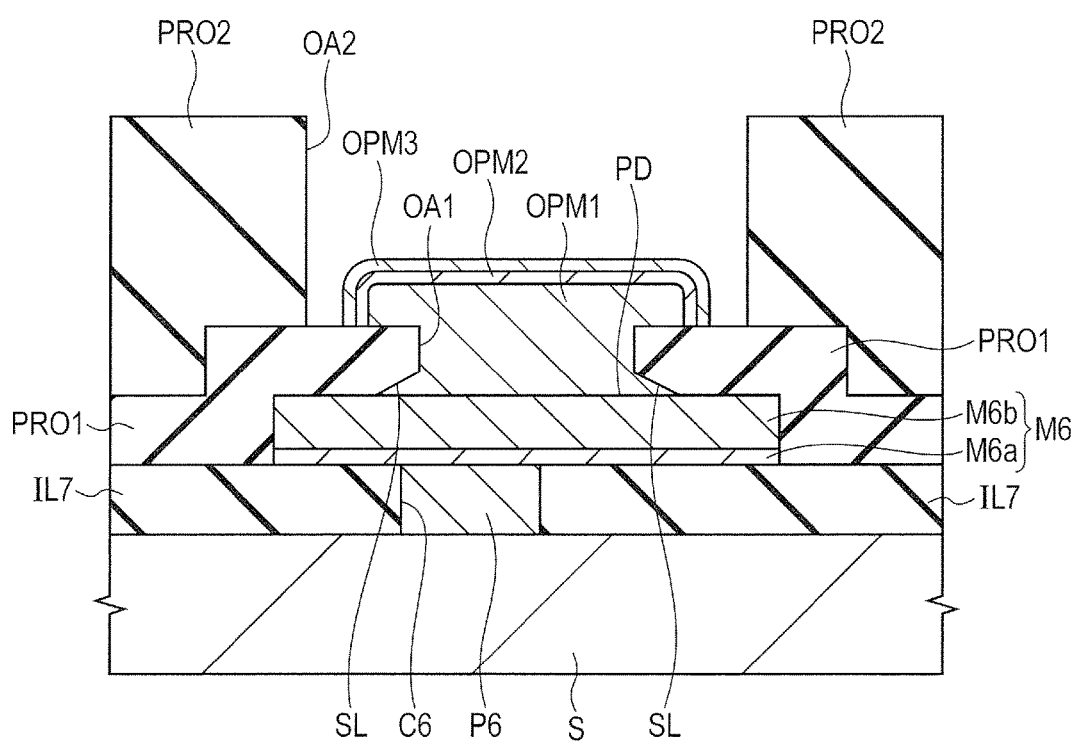
FIG. 25 is a section view illustrating a configuration of the semiconductor device of the first application of the third embodiment.

FIGS. 24 and 25 are each a section view illustrating a configuration of a semiconductor device of the first application of the third embodiment. In FIG. 24, an n-channel MISFET and a p-channel MISFET are provided on the main surface of the semiconductor substrate S. The n-channel MISFET includes a gate electrode GEn formed on the semiconductor substrate S with a gate insulating film GI in between, and an n semiconductor region Dn formed in a semiconductor substrate (p well PW) S on either side of the gate electrode GEn. The n semiconductor region Dn is a source or drain region having an LDD structure including a low-concentration semiconductor region and a high-concentration semiconductor region. The p-channel MISFET includes a gate electrode GEp formed on the semiconductor substrate S with a gate insulating film GI in between, and a p semiconductor region Dp formed in the semiconductor substrate (n well NW) S on either side of the gate electrode GEp. The p semiconductor region Dp is a source or drain region having an LDD structure and including a low-concentration semiconductor region and a high-concentration semiconductor region. A sidewall SW is provided on both sides of each of the gate electrodes GEp and GEn.

An interlayer insulating film IL1 is provided over the n-channel MISFET and the p-channel MISFET. Plugs P1 are provided in the interlayer insulating film IL1. An interconnection M1 is provided in an interlayer insulating film IL2 on the interlayer insulating film IL1. An interlayer insulating film IL3 is provided over the interconnection M1, and plugs P2 and an interconnection M2 are provided in the interlayer insulating film IL3. Similarly, plugs P3 and an interconnection M3 are provided in an interlayer insulating film IL4, plugs P4 and an interconnection M4 are provided in an interlayer insulating film IL5, and plugs P5 and an interconnection M5 are provided in an interlayer insulating film IL6. Plugs P6 are provided in an interlayer insulating film IL7 on the interlayer insulating film IL6. An interconnection M6 is provided on the interlayer insulating film IL7 and the plugs P6. The interconnection M6 includes a stacked film of a barrier metal film and an Al film, for example. In this exemplary case, the interconnection M6 is a top-layer interconnection.

As illustrated in FIG. 25, the semiconductor device of the first application includes the semiconductor substrate S, the interlayer insulating film IL7 provided above the semiconductor substrate S, and the interconnection M6 provided on the interlayer insulating film IL7. The n-channel MISFET and the p-channel MISFET are provided as the semiconductor element in the main surface of the semiconductor substrate S, and multilayer interconnections (M1 to M6) are provided above the semiconductor element (FIG. 24). For example, the interconnection M6 is electrically coupled to the semiconductor element (n-channel MISFET) via the plugs and other interconnections.

The interconnection M6 includes a stacked film of a barrier metal film M6a and an Al film M6b, for example. Protective films PRO1 and PRO2 each including an insulating film are provided over the interconnection M6. An opening OA1 is provided in the protective film PRO1, and part of the interconnection M6 is exposed from the bottom of the opening OA1. Such an exposed portion of the interconnection M6 serves as a pad region PD. The protective film PRO2 has an opening OA2 that is disposed on the opening OA1 and a size larger than the opening OA1.

As with the first embodiment, the protective film PRO1 includes, for example, a silicon oxynitride film, and the protective film PRO2 includes, for example, a polyimide film.

A plating film OPM1 (for example, Ni film) is provided over the pad region PD being the bottom of the opening OA1. A plating film OPM2 (for example, Pd film) is provided over the plating film OPM1. A plating film OPM3 (for example, Au film) is provided over the plating film OPM2.

In the third embodiment, as with the first embodiment, a slit (side slit, recess) SL is provided in the side face of the opening OA1. The plating film OPM1 is also provided in the slit SL.

In this way, the slit SL is provided in the side face of the opening OA1, and the plating film OPM1 is also provided in the slit SL, making it possible to improve electrical coupling between the plating film OPM1 and the interconnection M1. Specifically, as described with reference to FIGS. 2 and 3 in the first embodiment, it is possible to suppress expansion of the corroded portion MC into the pad region PD due to penetration of a plating solution or washings.

A manufacturing process of the semiconductor device of the third embodiment is now described. Although formation processes of the n-channel MISFET, the p-channel MISFET, and the multilayer interconnections (M1 to M6) above the MISFETs are not particularly limited, an exemplary formation process is briefly described below with reference to FIG. 24.

A trench is formed in each element isolation region of the semiconductor substrate S, and the inside of the trench is filled with an insulting film, thereby an isolation section STI is formed. Subsequently, an impurity having p conductivity is ion-implanted into the semiconductor substrate S to form the p well PW, while an impurity having n conductivity is ion-implanted into the semiconductor substrate S to form the n well NW. Subsequently, the gate insulating film GI and the gate electrodes GEn and GEp are formed on the semiconductor substrate S. For example, a silicon oxide film is formed as the gate insulating film GI by a CVD process, and a polysilicon film is formed on the silicon oxide film by a CVD process. Subsequently, the polysilicon film is patterned to form the gate electrode GE.

Subsequently, an impurity having n conductivity is ion-implanted into the p well PW on either side of the gate electrode GEn and thus a low-concentration impurity region is formed. An impurity having p conductivity is ion-implanted into the n well NW on either side of the gate electrode GEp and thus a low-concentration impurity region is formed. Subsequently, a sidewall SW is formed on each of sidewalls of the gate electrodes GEn and GEp.

Subsequently, an impurity having n conductivity is ion-implanted into the p well PW on either side of the gate electrode GEn and thus a high-concentration impurity region is formed. An impurity having p conductivity is ion-implanted into the n well NW on either side of the gate electrode GEp and thus a high-concentration impurity region is formed. In this way, the n semiconductor region Dn and the p semiconductor regions Dp, which each serve as a source or a drain, are formed.

Subsequently, the interlayer insulating film IL1 is formed over the n-channel MISFET and the p-channel MISFET on the semiconductor substrate S, and then the contact holes C1 are formed in the interlayer insulating film IL1. Subsequently, the inside of the contact hole C1 is filled with, for example, tungsten (W) and thus the plugs P1 are formed. Subsequently, the interlayer insulating film IL2 having interconnection trenches is formed over the plugs P1, and the inside of each interconnection trench is filled with Cu, for example. In this way, the interconnection M1 is formed (single damascene process). For example, the interlayer insulating film IL2 includes a stacked film of a thin silicon nitride film and a silicon oxide film on the silicon nitride film (the same holds true for IL3 to IL6).

Furthermore, the second-layer interconnection M2 to the fifth-layer interconnection M5 are formed. The interconnections M2 to M5 are formed by what is called a dual damascene process. For example, the interlayer insulating film IL3 is formed on the interlayer insulating film IL2, and contact holes C2 and interconnection trenches are formed in the interlayer insulating film IL3. The contact holes C2 and the interconnection trenches are filled with Cu, and thus the plugs P2 and the interconnection M2 are formed at the same time. Similarly, the interlayer insulating film IL4, the plugs P3, and the interconnection M3 are formed, and then the interlayer insulating film IL5, the plugs P4, and the interconnection M4 are formed, and then the interlayer insulating film IL6, the plugs P5, and the interconnection M5 are formed.

Subsequently, the interlayer insulating film IL7 including a silicon oxide film is formed over the interconnection M5. Subsequently, the interlayer insulating film IL7 is processed to form contact holes C6. The inside of each contact hole C5 is filled with, for example, W, thereby each plug P6 is formed.

Subsequently, the barrier metal film M6a is formed on the interlayer insulating film IL7, and the Al film M6b is formed thereon. The barrier metal film includes, for example, a Ti film, a TiN film, or a stacked film of the Ti film and the TiN film. Such films (M6a and M6b) are patterned to form the interconnection M6.

Subsequently, as in the first embodiment, the protective film PRO1 is formed over the interconnection M6, and the protective film PRO1 is removed from the pad region PD of the interconnection M1 (Al film) by dry etching, thereby the opening OA1 is formed. The interconnection M6 (Al film) in the pad region PD is exposed through such dry etching. Furthermore, undercut is formed through subsequent over-etching, and thus the slit SL is formed in the bottom portion of the side face of the opening OA1. Subsequently, as in the first embodiment, the protective film (polyimide film) PRO2 having the opening OA2 is formed.

Subsequently, the plating films OPM1, OPM2, and OPM3 are sequentially formed in the opening OA1. For example, a Ni film is formed as the plating film OPM1 by an electroless plating process. Subsequently, the plating film OPM2 is formed over the plating film OPM1. For example, a palladium (Pd) film is formed as the plating film OPM2 by an electroless plating process. Subsequently, the plating film OPM3 is formed over the plating film OPM2. For example, an Au film is formed as the plating film OPM3 by an electroless plating process. In this way, three layers of metal films may be used as over-pad metal.

In this way, in the third embodiment, the slit SL is provided in the side face of the opening OA1, and the plating film (Ni film) OPM1 is grown in the slit SL. It is therefore possible to suppresses expansion of the corroded portion MC into the interconnection (pad region PD) M1.

Second Application

A bonding wire BW may be provided on the plating film OPM2 described in the first embodiment.

Figure 26:
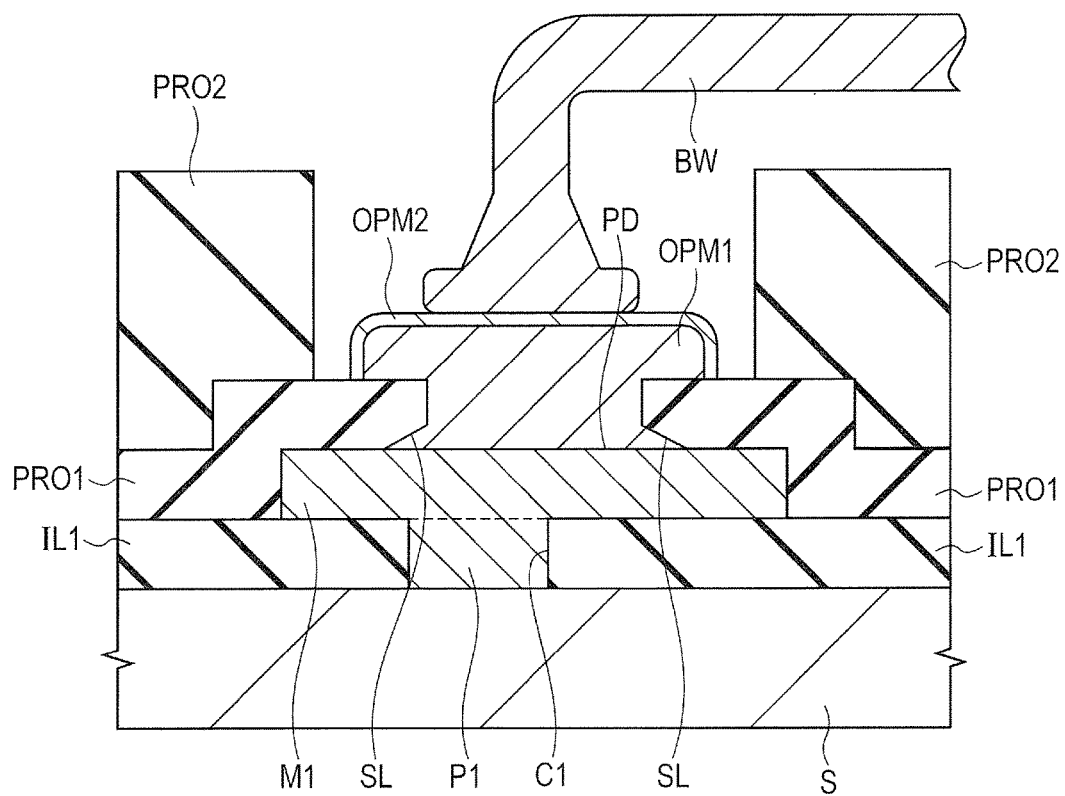
FIG. 26 is a section view illustrating a configuration of a semiconductor device of a second application of the third embodiment.

FIG. 26 is a section view illustrating a configuration of a semiconductor device of a second application of the third embodiment.

For example, as described in the first embodiment, the semiconductor substrate S is subjected to dicing to be formed into individual semiconductor chips. Subsequently, the semiconductor chip is bonded onto a die pad of a lead frame with a paste-like adhesive (for example, silver (Ag) paste) or the like. Subsequently, the pad region PD is coupled to a lead via a bonding wire BW (wire bonding). For example, one end of a Cu wire is melted into a ball shape by arc discharge, and the ball is bonded onto the plating film OPM2 by thermocompression. The other end of the Cu wire is bonded onto the top of the lead by thermocompression.

The bonding wire BW may be provided on the plating film (OPM2 or OPM3) described in each of the second embodiment and the first application.

Third Application

Clip bonding may be performed on the plating film OPM2 described in the first embodiment.

Figure 27:
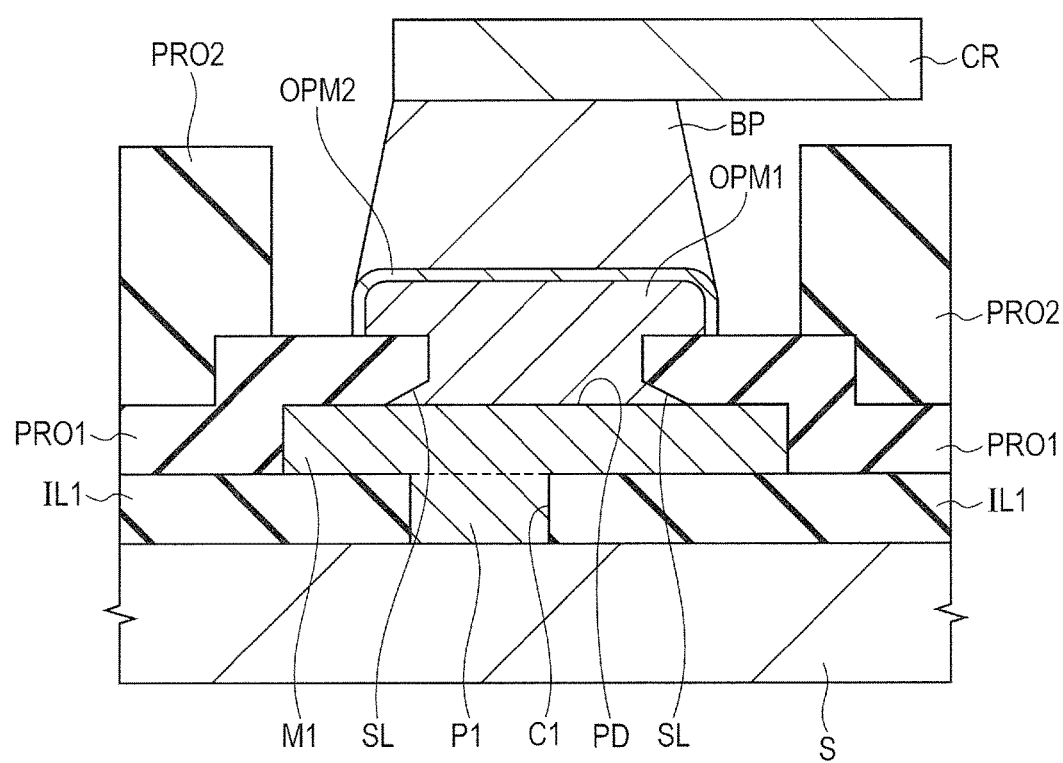
FIG. 27 is a section view illustrating a configuration of a semiconductor device of a third application of the third embodiment.

FIG. 27 is a section view illustrating a configuration of a semiconductor device of a third application of the third embodiment.

For example, as described in the first embodiment, the semiconductor substrate S is subjected to dicing to be formed into individual semiconductor chips. Subsequently, the semiconductor chip may be fixed onto a clip CR. For example, a solder paste BP is disposed on the plating film OPM3. Subsequently, the plating film OPM3 is electrically coupled to the solder paste BP with a metal frame CR such as a copper frame, i.e., by what is called clip bonding.

While not shown, when a back electrode is provided on the back of the semiconductor substrate S (see FIG. 4), for example, the back side of the semiconductor substrate S may be electrically coupled to a chip mount frame or the like via a solder paste.

The clip bonding using the metal frame CR may be performed on the plating film (OPM2 or OPM3) described in one of the second embodiment and the first application.

Fourth Application

Figure 28:
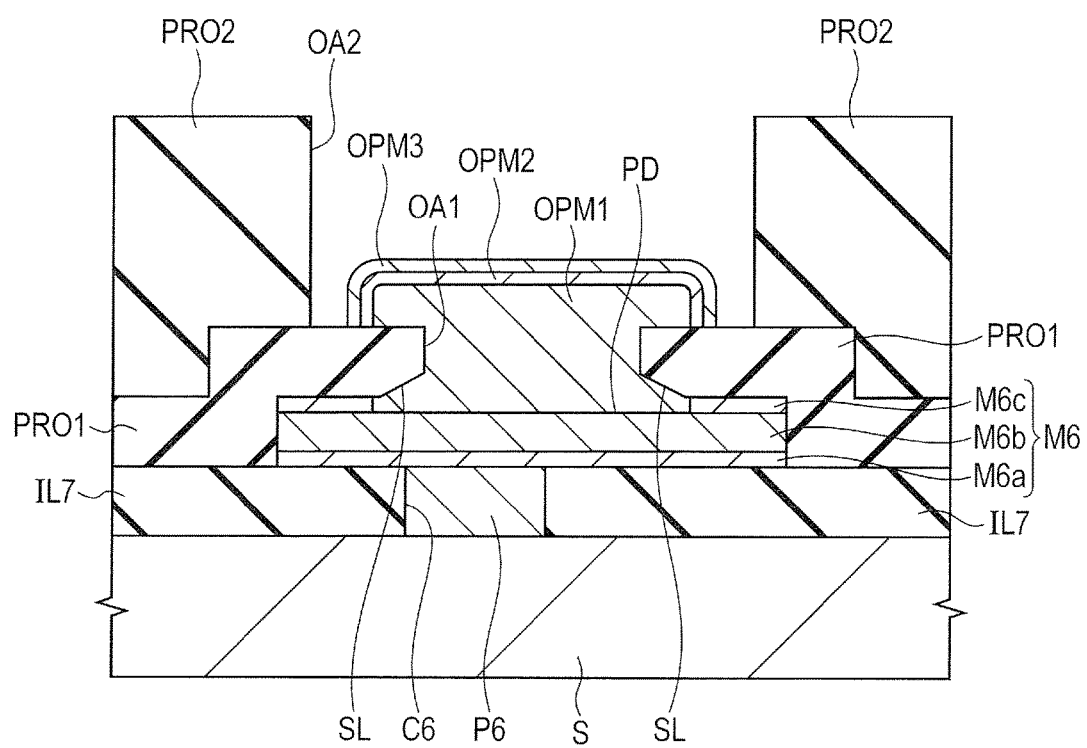
FIG. 28 is a section view illustrating a configuration of a semiconductor device of a fourth application of the third embodiment.

FIG. 28 is a section view illustrating a configuration of a semiconductor device of a fourth application of the third embodiment. Although the interconnection M6 as the top-layer interconnection has a two-layer structure including the barrier metal film M6a and the Al film M6b on the barrier metal film M6a in the first application (FIG. 25), the interconnection M6 as the top-layer interconnection may have a three-layer structure including the barrier metal film M6a, the Al film M6b, and a barrier metal film M6c.

In such a case, after the top-layer barrier metal film M6c is removed, plating films (OPM1, OPM2, OPM3) are formed. For example, the protective film PRO1 is dry-etched with a photoresist film as a mask. Even after the interconnection M6 is exposed, the protective film PRO1 is further etched, i.e., subjected to overetching. In this way, overetching is performed after the interconnection M6 is exposed, thereby the slit SL can be formed in the bottom portion of the side face of the opening OA1 (see FIG. 25). Subsequently, the barrier metal film M6c as the top part of the interconnection M6 is removed to expose the Al film M6b, and the plating film OPM1 and the like are formed over the Al film M6b.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A semiconductor device, comprising:
   a first insulating film provided above a semiconductor substrate;
   a first interconnection provided over the first insulating film;
   a second insulating film provided over the first interconnection and having a first opening;
   a plating film provided in the first opening; and
   a slit penetrating a side face of the second insulating film adjacent to the first opening,
   wherein a bottom of the first opening is a pad region being part of the first interconnection,
   wherein the plating film is also provided in the slit,
   wherein the first interconnection contains aluminum (Al), and
   wherein the plating film contains a metal selected from nickel (Ni), gold (Au), and palladium (Pd).

2. The semiconductor device according to claim 1,
   wherein the plating film contains nickel (Ni), and
   further comprising a second plating film provided on the plating film and containing gold (Au).

3. The semiconductor device according to claim 2, further comprising a third plating film containing palladium (Pd) between the plating film and the second plating film.

4. The semiconductor device according to claim 1, further comprising one of a bonding wire and a metal frame provided over the plating film.

5. The semiconductor device according to claim 1, further comprising a third insulating film that is provided over the second insulating film and has a second opening over the first opening.

6. The semiconductor device according to claim 5, wherein the second insulating film is a film selected from a silicon nitride film, a silicon oxynitride film, and a silicon oxide film.

7. The semiconductor device according to claim 6, wherein the third insulating film is a polyimide film.

8. The semiconductor device according to claim 1, wherein the plating film fills the first opening and the slit.

9. The semiconductor device according to claim 1,
wherein a first portion of the plating film is formed over a first portion of the second insulating film,
wherein a second portion of the plating film is formed within the slit, and
wherein the first portion of the second insulating film is between the first and second portions of the plating film.

10. A method of manufacturing a semiconductor device, the method comprising:
(a) forming a first insulating film above a semiconductor substrate;
(b) forming a first interconnection over the first insulating film;
(c) forming a second insulating film over the first interconnection;
(d) removing the second insulating film over the first interconnection, thereby forming a first opening exposing a pad region that is part of the first interconnection; and
(e) after (d), forming a plating film over the pad region,
wherein in (d), a slit is formed so as to penetrate a side face of the second insulating film adjacent to the first opening,
wherein in (e), the plating film is formed in the slit,
wherein the first interconnection contains aluminum (Al), and
wherein the plating film contains a metal selected from nickel (Ni), gold (Au), and palladium (Pd).

11. The method according to claim 10, wherein (d) comprises removing the second insulating film by dry etching.

12. The method according to claim 11, wherein the dry etching in (d) involves overetching performed after the pad region is exposed.

13. The method according to claim 10,
wherein (e) comprises:
forming the plating film containing nickel (Ni) over the pad region, and
forming a second plating film containing gold (Au) over the plating film.

14. The method according to claim 10,
wherein (e) comprises:
forming the plating film containing nickel (Ni) over the pad region,
forming a second plating film containing palladium (Pd) over the plating film, and
forming a third plating film containing gold (Au) over the second plating film.

15. The method according to claim 10, further comprising:
(f) providing one of a bonding wire and a metal frame over the plating film.

16. The method according to claim 10, further comprising:
between (d) and (e),
(g) forming a third insulating film over the second insulating film; and
(h) forming a second opening in the third insulating film, wherein the second opening in (h) is formed over the first opening.

17. The method according to claim 16, wherein the second insulating film is a film selected from a silicon nitride film, a silicon oxynitride film, and a silicon oxide film, and the third insulating film is a polyimide film.

* * * * *